United States Patent
Lee et al.

(10) Patent No.: US 12,329,041 B2
(45) Date of Patent: **\*Jun. 10, 2025**

(54) MAGNETIC TUNNELING JUNCTION WITH SYNTHETIC FREE LAYER FOR SOT-MRAM

(71) Applicant: Taiwan Semiconductor Manufacturing Co., Ltd., Hsinchu (TW)

(72) Inventors: Chien-Min Lee, Hsinchu (TW); Shy-Jay Lin, Jhudong Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/447,912

(22) Filed: Aug. 10, 2023

(65) Prior Publication Data

US 2023/0389448 A1  Nov. 30, 2023

Related U.S. Application Data

(62) Division of application No. 17/145,048, filed on Jan. 8, 2021, now Pat. No. 11,844,287.
(Continued)

(51) Int. Cl.
*H10N 52/80* (2023.01)
*H01F 10/32* (2006.01)
(Continued)

(52) U.S. Cl.
CPC ......... *H10N 52/80* (2023.02); *H01F 10/3254* (2013.01); *H01F 10/3272* (2013.01);
(Continued)

(58) Field of Classification Search
None
See application file for complete search history.

(56) References Cited

U.S. PATENT DOCUMENTS

| | | | |
|---|---|---|---|
| 9,076,537 B2 | 7/2015 | Khvalkovskiy et al. | |
| 11,844,287 B2 * | 12/2023 | Lee | H10B 61/22 |

(Continued)

FOREIGN PATENT DOCUMENTS

| | | |
|---|---|---|
| CN | 111183480 A | 5/2020 |
| DE | 102013109012 A1 | 3/2014 |

(Continued)

OTHER PUBLICATIONS

Fukami et al., "A sub-ns three-terminal spin-orbit torque induced switching device", IEEE, Symposium on VLSI Technology Digest of Technical Papers, 2016, 2 pages.

*Primary Examiner* — Benjamin P Sandvik
(74) *Attorney, Agent, or Firm* — Slater Matsil, LLP

(57) ABSTRACT

A magnetic memory device includes a spin-orbit torque (SOT) induction spin Hall electrode and a free layer of a magnetic tunnel junction (MTJ) stack disposed on the spin Hall electrode which is a synthetic anti-ferromagnetic structure. The free layer has a magnetic moment which is askew of the long axis of the MTJ stack and askew the direction of current flow through the spin Hall electrode. The MTJ stack internally generates a magnetic field to switch the state of the free layer. The free layer includes a first layer separated from a second layer by a spacer layer, where the first layer and the second layer may have the same or different crystalline structures.

20 Claims, 24 Drawing Sheets

Related U.S. Application Data

(60) Provisional application No. 63/027,643, filed on May 20, 2020.

(51) Int. Cl.
    *H01F 41/30*     (2006.01)
    *H10N 50/01*     (2023.01)
    *H10N 50/10*     (2023.01)
    *H10N 50/80*     (2023.01)
    *H10N 50/85*     (2023.01)
    *H10N 52/00*     (2023.01)
    *H10N 52/01*     (2023.01)

(52) U.S. Cl.
    CPC ......... *H01F 10/329* (2013.01); *H01F 41/302* (2013.01); *H10N 50/01* (2023.02); *H10N 50/10* (2023.02); *H10N 50/80* (2023.02); *H10N 50/85* (2023.02); *H10N 52/01* (2023.02); *H10N 52/101* (2023.02)

(56) References Cited

U.S. PATENT DOCUMENTS

| | | | |
|---|---|---|---|
| 2004/0120184 A1* | 6/2004 | Janesky | H10N 50/01 365/158 |
| 2007/0253118 A1 | 11/2007 | Hayakawa et al. | |
| 2013/0015538 A1 | 1/2013 | Liu et al. | |
| 2014/0056061 A1* | 2/2014 | Khvalkovskiy | H01F 41/325 365/158 |
| 2014/0252439 A1 | 9/2014 | Guo | |
| 2014/0264671 A1 | 9/2014 | Chepulskyy et al. | |
| 2016/0300999 A1 | 10/2016 | Yi et al. | |
| 2017/0177514 A1 | 6/2017 | Lee | |
| 2017/0179372 A1 | 6/2017 | Braganca | |
| 2017/0200499 A1 | 7/2017 | Rakshit et al. | |
| 2018/0219152 A1 | 8/2018 | Apalkov et al. | |
| 2018/0351085 A1 | 12/2018 | Shiokawa et al. | |
| 2019/0304524 A1 | 10/2019 | Oguz et al. | |
| 2019/0363244 A1 | 11/2019 | Sasaki et al. | |
| 2019/0386662 A1 | 12/2019 | Lin et al. | |
| 2020/0006625 A1 | 1/2020 | Oguz et al. | |
| 2020/0006630 A1* | 1/2020 | Sato | G11C 11/1673 |
| 2020/0013444 A1 | 1/2020 | Min et al. | |
| 2020/0083431 A1 | 3/2020 | Iwasaki et al. | |
| 2020/0135804 A1 | 4/2020 | Luo et al. | |
| 2020/0136022 A1 | 4/2020 | Lin et al. | |
| 2020/0136023 A1 | 4/2020 | Tsumita et al. | |
| 2020/0312908 A1 | 10/2020 | Oguz et al. | |

FOREIGN PATENT DOCUMENTS

| | | |
|---|---|---|
| JP | 2005535115 A | 11/2005 |
| KR | 20130009570 A | 1/2013 |
| KR | 20200050352 A | 5/2020 |
| WO | 2004012197 A2 | 2/2004 |
| WO | 2019005156 A1 | 1/2019 |

* cited by examiner

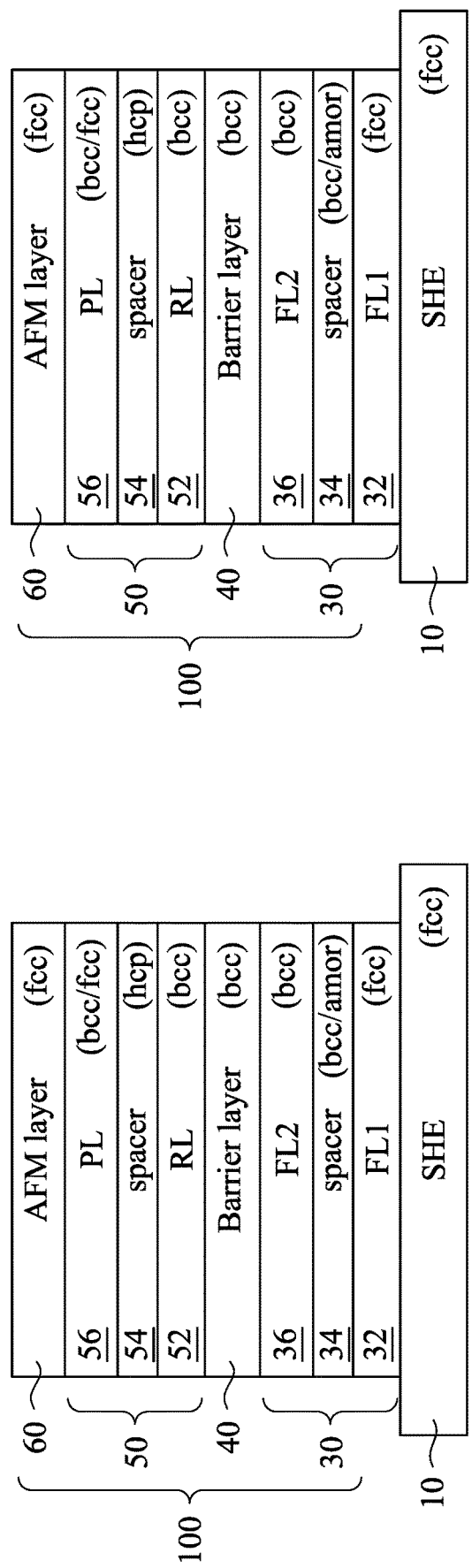

MAGNETIC TUNNELING JUNCTION WITH SYNTHETIC FREE LAYER FOR SOT-MRAM

PRIORITY CLAIM AND CROSS-REFERENCE

This application is a divisional of U.S. patent application Ser. No. 17/145,048, entitled "Magnetic Tunneling Junctions with Synthetic Free Layer for SOT-MRAM," filed on Jan. 8, 2021, which application claims priority to U.S. Provisional Application No. 63/027,643, filed on May 20, 2020, which applications are hereby incorporated by reference herein as if reproduced entirely herein.

BACKGROUND

A magnetic random access memory (MRAM) offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. One type of an MRAM is a spin transfer torque magnetic random access memory (STT-MRAM). An STT-MRAM utilizes a magnetic tunneling junction (MTJ) written at least in part by a current driven through the MTJ. Another type of an MRAM is a spin orbit torque (SOT) MRAM (SOT-MRAM), which generally requires a lower switching current than an STT-MRAM.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

FIGS. 4A, 4B, and 4C are illustrations of MTJ film stacks, in accordance with various embodiments.

DETAILED DESCRIPTION

Figure 1:
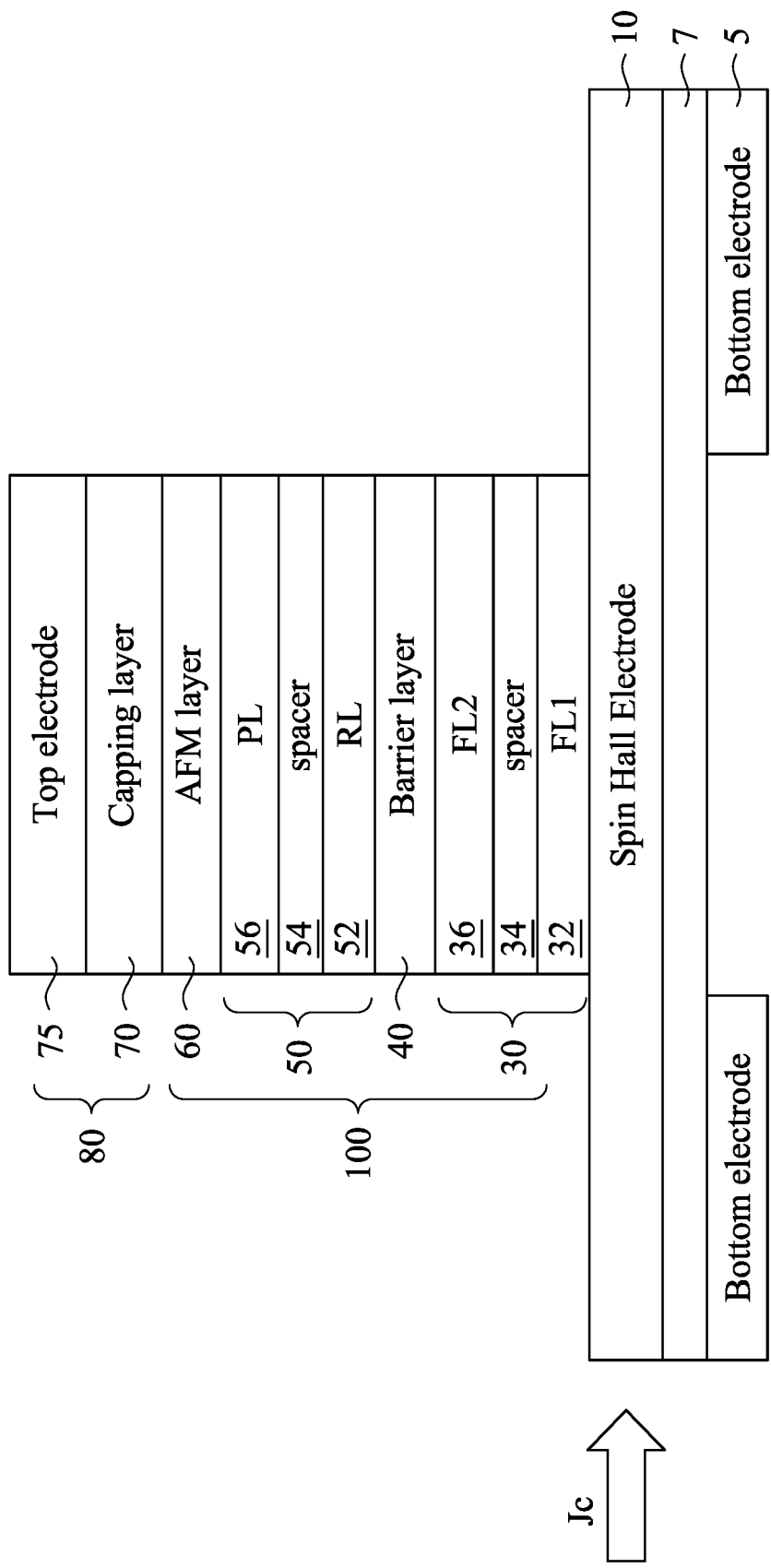
FIGS. 1 through 3 are schematic views of an SOT-MRAM cell according to some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes, and/or operations described with respect to one embodiment may be employed in the other embodiments, and detailed explanation thereof may be omitted.

Embodiments use a synthetic free layer in an MTJ film stack instead of a single layer free layer. The synthetic free layer includes a pair of magnetic layers separated by a spacer layer. As current travels through the spin Hall electrode to induce SOT on the free layer, the resulting magnetic field is tilted from the x-axis. This tilt may be used to switch the free layer magnetization without the need for an external field and without the need to manually tilt the spin Hall electrode or the MTJ ellipse pattern when the spin Hall electrode orientation is fixed.

A spin-torque-transfer magnetic random-access memory (STT-MRAM), is one of the next generation memory technologies for CMOS integrated circuits (ICs). However, fast access applications, such as low-level cache require fast speeds and write speed is much slower than read speed. The cache application for a central processing unit (CPU) and/or a microcontroller (MCU) additionally requires low-power consumption. An STT-RAM, however, takes substantial current to change the magnetization state during the write operation. An STT-MRAM cell generally includes a magnetic tunnel junction (MTJ) film stack having a free magnetic layer, a reference or pinned magnetic layer and a tunnel barrier layer made of a non-ferromagnetic material, such as MgO. The free layer is the magnetic layer which has two energetically equivalent magnetic states, with the magnetization in the free layer parallel or antiparallel to the magnetization of the reference layer. By applying a current perpendicular to the MTJ film stack, the magnetic orientation (moment) of the free magnetic layer can be changed, thereby writing data to the STT-MRAM cell.

In contrast, spin-orbital-transfer (or spin-orbital-torque) (SOT) magnetic switching has the potential to provide order-of-magnitude improvement on write current and speed. SOT has promising applications for high-speed, low power memory cache.

In an SOT-MRAM, the magnetic moment of the free magnetic layer of an MTJ film stack is switched using the spin-orbit interaction effect caused by a current flowing adjacent to the MTJ film stack. This current can flow in a spin Hall electrode (SHE). Manipulating the free magnetic layer causes a resistance change across the free magnetic layer, which may be used to determine a data value in the cell. The magnetic moment of the free magnetic layer may be switched using only the spin-orbit interaction effect or the magnetic moment of the free magnetic layer may be switched using a combination of effects.

There are three general types of SOT-MRAM, which vary based on the shape and orientation of the MTJ stack in relation to the current flow through the spin Hall electrode. A field is required to switch the magnetic moment of the free layer using SOT and that field may be generated internally or it may be generated externally. Externally generated SOT-MRAM devices are undesirable due to the complexity, space, and power required to use an externally generated field. An x-type of SOT-MRAM has an MTJ film stack which is elongated in the x-direction and a magnetic moment which is parallel to the current through the spin Hall electrode, and usually requires an externally generated magnetic field which is orthogonal to the plane of the current flow in the spin Hall electrode. A y-type of SOT-MRAM has an MTJ film stack which is elongated in the y-direction and a magnetic moment which is perpendicular to, but in the same plane as, the direction of the current through the spin Hall electrode. A z-type of SOT-MRAM has an MTJ film stack which is typically circular (though may be elliptical) and a magnetic moment which is orthogonal to the plane of the current flow through the spin Hall electrode.

Each of the different types of SOT-MRAM devices have certain advantages and disadvantages. The x-type of SOT-MRAM is desirable because it requires the least amount of power to operate and uses the least amount of space among the three, however it usually requires an externally generated magnetic field to assist the free layer switching. Various alterations have been attempted to the design of the x-type of SOT-MRAM in the attempt to eliminate the need for an externally generated magnetic assistant field. In other words, such changes are made in an attempt to provide an internally generated assistance field. In one such change, the MTJ stack, which is usually oriented with its longest axis in line with the x-axis and in-line with the current through the spin Hall electrode, is instead canted or rotated about the z-axis while the current through the spin Hall electrode is still along the x-axis, thereby generating magnetic moment which has both x and y components of magnitude. Any angle of rotation between 0° and 90° may be realized, and in some embodiments, the angle of rotation may be between about 5° and 45°, though other angles may be used. These complex fields can be used to switch the free layer without the need for an external assistant field. However, because the MTJ stack is rotated, it takes up more space and so the memory density is reduced.

As noted above, embodiments disclosed herein use a synthetic free layer including two magnetic layers separated by a spacer layer. This arrangement provides a magnetic moment which is offset from the x-axis, containing both x and y magnitudes without the need to rotate the MTJ stack about the z-axis, providing a greater memory density than some devices. The resulting magnetic moment can be switched by spin orbit torque without needing an external magnetic assistant field.

Although the present disclosure generally relates to an x-type of SOT-MRAM, some of the aspects discussed herein may be transferrable to the other types of SOT-MRAM devices.

FIG. 1 illustrates a schematic view of the SOT-MRAM function elements of a SOT-MRAM cell 90 (see FIG. 3) according to some embodiments of the present disclosure. These elements may include a bottom electrode 5, a spin Hall electrode 10, an MTJ film stack 100, an optional capping layer 70 over the MTJ film stack 100, and a top electrode 75 over the capping layer 70. It should be understood that these layers may include multiple sub-layers comprising different materials, which will be discussed in detail below. The spin Hall electrode 10 serves as a spin-orbit interaction active layer to provide induction influence on the MTJ film stack 100.

Although the basic structure of the MTJ film stack 100 and spin Hall electrode 10 are the same for the various embodiments discussed herein, several configurations may be used which vary on the materials used in the different layers and their respective crystalline structures. A synthetic free layer 30 is disposed over the spin Hall electrode 10, a barrier layer 40 is disposed over the synthetic free layer 30, and a reference layer structure 50 is disposed over the barrier layer 40. An antiferromagnetic layer 60 is disposed over the reference layer structure 50. In some embodiments a capping layer 70 may be disposed over the antiferromagnetic layer 60. The reference layer structure 50 may include a reference layer 52 and a pinned layer 56 with a spacer interposed between the reference layer 52 and the pinned layer 56. In some embodiments, the antiferromagnetic layer 60 may be utilized as the pinned layer instead of a separate pinned layer 56. The arrangement depicted in FIG. 1 is considered a "top pinned" device, since the pinned layer is positioned on top of the MTJ film stack 100.

With reference to FIG. 1, the magnetic moment of the synthetic free layer 30 is switched using the spin-orbit interaction effect. In some embodiments, the magnetic moment of the synthetic free layer 30 is switched using only the spin-orbit interaction effect. In other embodiments, the magnetic moment of the synthetic free layer 30 is switched using a combination of effects. For example, the magnetic moment of the synthetic free layer 30 is switched using spin transfer torque as a primary effect that may be assisted by torque induced by the spin-orbit interaction. In other embodiments, the primary switching mechanism is torque induced by the spin-orbit interaction. In such embodiments, another effect including, but not limited to, spin transfer torque, may assist in switching.

The spin Hall electrode 10 may be formed over an optional bottom electrode 5. The bottom electrode 5 may include one or more layers of Ta, TiN, TaN, Ru, Au, W, or Cu. The bottom electrode 5 may be deposited by any suitable process, such as by damascene in the case of a Cu bottom electrode 5 or by depositing a metal plug in the case of a W bottom electrode 5. An optional buffer layer 7 interposed between the bottom electrode 5 and the spin Hall electrode 10 may include an insulating material layer deposited thinly, such as magnesium oxide deposited to a thickness between 2 Å and 9 Å.

As noted above, the spin Hall electrode 10 is a spin orbit active interface that has a strong spin-orbit interaction and that can be used in switching the magnetic moment of the synthetic free layer 30. The spin Hall electrode 10 is used in generating a spin-orbit magnetic field $H_y$ (see FIG. 2). More specifically, a current Jc is driven in a plane through the spin Hall electrode 10. Due to spin Hall effect, the spin-orbit magnetic field $H_y$ is generated perpendicular (orthogonal) to the direction of the current Jc. This spin-orbit magnetic field $H_y$ is equivalent to the spin-orbit torque T on magnetization, where $T=-\gamma[M\times H_y]$ in the synthetic free magnetic layer 30. The torque and magnetic field are thus interchangeably referred to as spin-orbit field and spin-orbit torque. This reflects the fact that the spin-orbit interaction is the origin of the spin-orbit torque and spin-orbit field. Spin-orbit torque occurs for the current Jc driven in a plane in the spin Hall electrode 10 and a spin-orbit interaction. In contrast, spin transfer torque is due to a perpendicular-to-plane current flowing through the synthetic free layer 30, the barrier layer 40 and the reference layer structure 50, that injects spin polarized charge carriers into the synthetic free layer 30. The spin-orbit torque T may rapidly deflect the magnetic moment of the synthetic free layer 30 from its equilibrium state. And due to the structure of the synthetic free layer, the equilibrium state is canted from the easy axis. The spin-orbit torque T may tilt the magnetization of the synthetic free layer 30 considerably faster than conventional STT torque of a similar maximum amplitude. In some embodiments, switching can be completed using spin-orbit torque. In other embodiments, another mechanism such as spin transfer may be used to complete switching. The spin-orbit field/spin-orbit torque generated may thus be used in switching the magnetic moment of the synthetic free layer 30.

For the spin Hall effect of the spin Hall electrode 10, a current Jc is driven in the plane of the spin Hall electrode 10 (i.e., current-in-plane, substantially in the x-y plane in FIG. 1) and in a direction which is parallel to the elongated axis of the MTJ film stack 100. In other words, the current Jc is driven perpendicular to the stacked direction of the films including the spin Hall electrode 10 and the synthetic free layer 30 (i.e., perpendicular to the normal to the surface, the z-direction in FIG. 1). Charge carriers having spins of a particular orientation perpendicular to the direction of current (y-direction) accumulate at the surfaces of the spin Hall electrode 10. A majority of these spin-polarized carriers diffuse into the synthetic free layer 30. This diffusion results in the torque T on the magnetization of the synthetic free layer 30. Since torque on the magnetization is equivalent to the effective magnetic field on the magnetization, as set forth above, the spin accumulation equivalently results in the field $H_y$ on the synthetic free layer 30. The spin-orbit field for the spin-Hall effect is the cross product of the spin-orbit polarization and the magnetic moment of the synthetic free layer 30. As such, the magnitude of the torque is proportional to the in-plane current density Jc and spin polarization of the carriers. The spin Hall effect may be used in switching the magnetic stacked layer shown in FIG. 1 when the polarization induced by the spin Hall effect is parallel to the easy axis of the synthetic free layer 30 (which is askew of the equilibrium magnetic moment of the synthetic free layer 30). To obtain the spin-orbit torque T, the current pulse is driven in plane through the spin Hall electrode 10. The resulting spin-orbit torque T counteracts damping torque, which results in the switching of the magnetization of the synthetic free layer 30 in an analogous manner to conventional STT switching.

The synthetic free layer 30 is a data storage layer having a magnetic moment that is switchable. Within the MTJ film stack 100 of a SOT-MRAM cell 90, the synthetic free layer 30 acts as a state-keeping layer, and its magnetic state determines the state of the SOT-MRAM cell 90. For example, the magnetic moment of the synthetic free layer 30 is controllable (e.g., by controlling a current flowing in the spin Hall electrode 10), and by controlling the magnetic moment of the synthetic free layer 30 in this manner, the resistance of the SOT-MRAM cell 90 may be put in a high-resistance state or a low-resistance state. Whether the SOT-MRAM cell 90 is in a high-resistance state or a low-resistance state depends on the relative orientations of the spin polarizations of the synthetic free layer 30 and the reference layer structure 50 (see below for more detail on the reference layer structure 50).

Figure 4C:
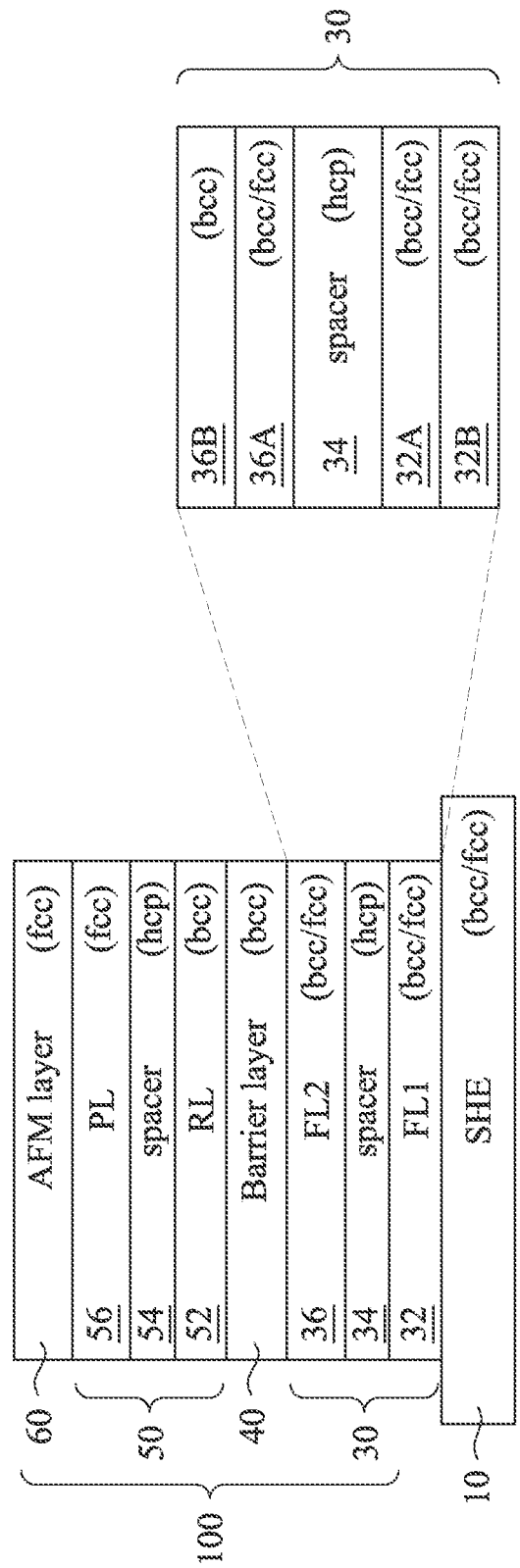

The following descriptions of the synthetic free layer 30, the barrier layer 40, and the reference layer structure 50 are generic to all of the embodiments discussed in greater detail with respect to FIGS. 4A, 4B, and 4C. The discussions with respect to FIGS. 4A, 4B, and 4C of the various embodiments elaborate on the details discussed with respect to FIG. 1.

The synthetic free layer 30 may be formed of one or more ferromagnetic materials, such as cobalt iron boron (CoFeB), cobalt/palladium (CoPd), cobalt iron (CoFe), cobalt iron boron tungsten (CoFeBW), iron boron (FeB), Co, alloys thereof, the like, or combinations thereof, and one or more non-ferromagnetic materials such as W, Ta, Mo, Cr, Ru, the like, or combinations thereof. The synthetic free layer 30 is arranged to be antiferromagnetic by including at least two layers of ferromagnetic materials, e.g. FL1 32 and FL2 36, separated by a spacer layer 34 of a non-ferromagnetic material. For example, the first magnetic layer FL1 32 may be coupled to a second magnetic layer FL2 36 through a RKKY (Ruderman-Kittel-Kasuya-Yosida) coupling. When the spacer layer 34 is in a certain thickness range, the coupling will be antiferromagnetic. When such a synthetic free layer is operated in antiferromagnetism, it can be referred to as being a synthetic antiferromagnetic free layer. For example, the spacer layer 34 may include W, Ta, Mo, Cr, or Ru.

As the thickness of the spacer layer 34 increases, the magnetic coupling between the FL1 32 and FL2 36 switches from parallel to anti-parallel and then back to parallel and so forth. Thus, if the thickness of the spacer layer 34 is too thin, the coupling will be parallel (or ferromagnetic), but if the thickness of the spacer layer 34 is thicker, then the magnetic coupling between the FL1 32 and the FL2 36 may be anti-parallel (or antiferromagnetic). As the thickness of the spacer layer 34 increases, the coupling strength (whether ferromagnetic or antiferromagnetic) between the first magnetic layer FL1 32 and the second magnetic layer FL2 36 decreases and effectively decouples when the spacer is greater than about 25 Å and 30 Å. The effective thickness of the spacer layer 34 for an antiferromagnetic coupling varies based on the materials of the FL1 32, the spacer layer 34, and FL2 36. Several embodiments are discussed below. For example, in some embodiments, such as when the spacer layer 34 is W and the FL1 32 and FL2 34 are CoFeB, the spacer layer 34 may be between about 4 Å and about 8 Å, such as between about 5 Å and about 7 Å, though other values are contemplated (depending on materials used for the spacer layer 34) and may be used. The first magnetic layer FL1 32 and the second magnetic layer FL2 36 may have a particular crystalline structure which together along with the spacer layer 34 heightens or lessens their antiferromagnetic effect. For example, in some embodiments, both FL1 32 and FL2 36 may have the same crystal structure, such as face-centered cubic (fcc), body-centered cubic (bcc), or hexagonal closest-packed (hcp), and in other embodiments, FL1 32 may have one crystal structure and FL2 36 may have another different crystal structure. In such embodiments, the spacer layer 34 may function as a structural barrier between FL1 32 and FL2 36 so that the crystal structure of each of the FL1 32 and the FL2 36 may be different.

The FL1 32 layer may be between about 0.5 nm and 2.5 nm thick and the FL2 32 layer may be between about 1.0 nm and 2.5 nm thick. The overall thickness of the synthetic free layer 30 may be between about 1.5 nm and about 5.0 nm.

In some embodiments, the barrier layer 40 is formed of one or more materials such as magnesium oxide, aluminum oxide ($AlO_x$) (e.g., $Al_2O_3$), $MgAl_2O_4$, even half metals, the like, or combinations thereof. In some embodiments, the material of the barrier layer 40 includes a crystalline material deposited to have a particular crystal structure, such as a bcc, fcc, or hcp structure, while in other embodiments, the material of the barrier layer 40 may be deposited amorphously. In some embodiments, the material of the barrier layer 40 may be deposited to have the same crystal structure as FL2 36 of the synthetic free layer 30. In some embodiments, the barrier layer 40 may have a thickness between about 0.5 nm and about 1.5 nm. In some cases, controlling the thickness of the barrier layer 40 may control the resistance ($R_{MTJ}$) of the MTJ film stack 100. For example, a thicker barrier layer 40 may increase the resistance of the MTJ film stack 100. In some embodiments, performance of a SOT-MRAM cell 90 can be improved by controlling the resistance $R_{MTJ}$ of the MTJ film stack 100 to match the parasitic resistance of the circuit(s) connected to the SOT-MRAM cell 90. In some cases, matching the resistances in this manner can increase the ranges of operational conditions over which the SOT-MRAM cell 90 can be read. The barrier layer 40 may be thin enough such that electrons are able to tunnel through the barrier layer 40.

The reference layer structure 50 may be a synthetic antiferromagnetic structure similar to the synthetic free layer 30. The magnetic moment of the reference layer structure 50, however, does not change. The reference layer structure 50 may be made of any of the same materials as the synthetic free layer 30 as set forth above, and may have the same material composition as the synthetic free layer 30. In some embodiments, the reference layer structure 50 includes one or more layers of magnetic materials. In some embodiments, the reference layer structure 50 includes a reference layer RL 52 which may include Co, Fe, Ni, CoFe, NiFe, FeB, CoFeB, CoFeBW, alloys thereof, the like, or combinations thereof. In some embodiments, the reference layer structure 50 may also include a pinned layer PL 56, which may also include Co, Fe, Ni, CoFe, NiFe, FeB, CoFeB, CoFeBW, alloys thereof, the like, or combinations thereof, and which may or may not be different than the material of the RL 52. A spacer layer 54 is interposed between the RL 52 and the pinned layer 56. The spacer layer 54 may be made of any suitable non-ferromagnetic material, such as Cu, Cr, Ru, Ir, Rh, Re, V, Nb, W, Ta, Mo, the like, or combinations thereof. Each of the layers of the reference layer structure 50 includes a crystalline material deposited to have a particular crystalline structure, such as an fcc, bcc, or hcp structure. The material of the reference layer RL 52 may be deposited to have the same crystalline structure type as the barrier layer 40, in some embodiments. In some embodiments, the spacer layer 54 may be used as a physical barrier so that the pinned layer 56 may have a different crystalline structure type than the reference layer 52. In some embodiments, a thickness of the reference layer 52 is in a range from about 2 nm to about 5 nm; a thickness of the spacer layer 54 is in a range from about 0.2 nm to about 1.5 nm; and a thickness of the pinned layer 56 is in a range from about 2 nm to about 5 nm. In some embodiments, the pinned layer 56 may be omitted and the anti-ferromagnetic layer 60 may serve as the pinned layer 56.

The Anti-Ferromagnetic (AFM) layer 60 is a hard bias layer used to pin the magnetization direction of the reference layer structure 50 in a fixed direction and may be referred to as a pinning layer. The AFM layer 60 and reference layer structure 50 may together avoid generating a stray field which may interfere with the synthetic free layer 30 of the SOT-MRAM cell 90 or an adjacent SOT-MRAM cell 90. Pinning the magnetization direction of the reference layer structure 50 or the reference layer 52 allows the SOT-MRAM cell 90 to be toggled between a low-resistance state and a high-resistance state by changing the magnetization direction of the synthetic free layer 30 relative to the reference layer 52. In other embodiments, the AFM layer 60 may be a layer of one or more metals having antiferromagnetic properties. For example, the AFM layer 60 may be made of platinum manganese (PtMn), iridium manganese (IrMn), iron manganese (FeMn), or combinations thereof deposited to have a crystal structure which is fcc. In some embodiments, the AFM layer 60 may have a thickness between about 10 nm and about 30 nm. In some embodiments, a thicker AFM layer 60 may have stronger antiferromagnetic properties, or may be more robust against external magnetic fields or thermal fluctuation.

The capping layer 70 may be a single or multi-layer structure that serves to protect the layers under the capping layer 70 during subsequent processes. In some embodiments, the capping layer 70 may also be used to provide a top electrode for an overlying via or metal line to connect to. The capping layer 70 may be formed of a non-ferromagnetic material such as Cu, Ru, Cr, Pt, W, Ta, Mo, Ti, TaN, TiN, the like, or combinations thereof. In some embodiments, the capping layer 70 may include two non-ferromagnetic material layers sandwiching another non-ferromagnetic material layer, such as another one of such as Cu, Ru, Cr, Pt, W, Ta, Mo, Ti, TaN, TiN, or the like. For example, in some embodiments, the capping layer may include Ta or Ti sandwiched between two layers of Ru. The thickness of the capping layer 70 may be between about 3 nm and about 10 nm, though other thicknesses are contemplated. In embodiments using multiple layers for the capping layer 70, each layer may be between about 1 nm and about 5 nm.

A separate top electrode 75 may be disposed over the capping layer 70. The top electrode 75 may be used to provide electrical connection to a conductive pattern coupled to the top of the MTJ film stack 100. The top electrode 75 may be formed of any suitable material, such as titanium, titanium nitride, tantalum, tantalum nitride, tungsten, the like, or combinations thereof. The capping layer 70 and/or top electrode 75 together may be referred to as layer 80.

Figure 2:
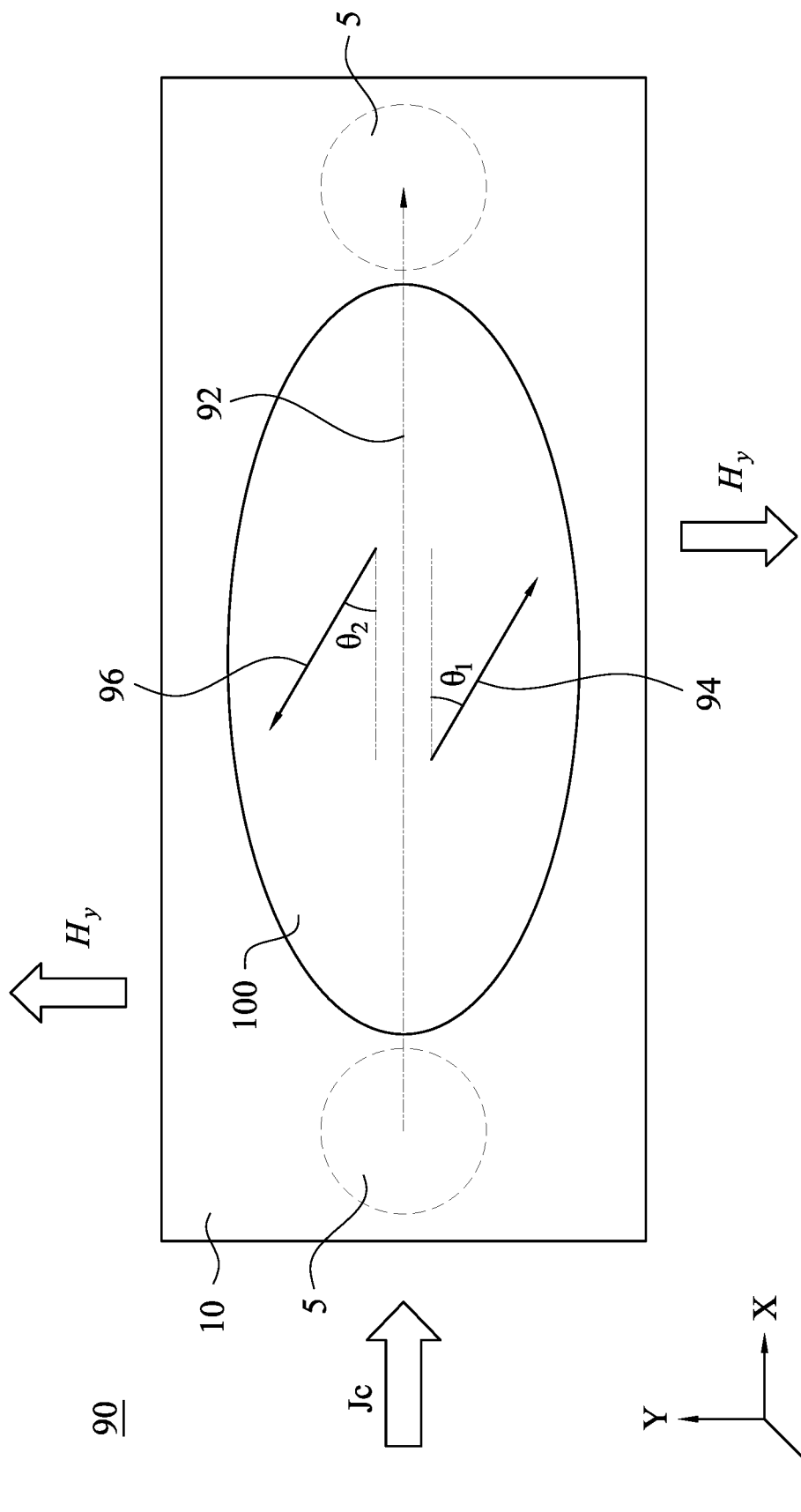

FIG. 2 illustrates a simplified top down schematic view of a SOT-MRAM cell 90 according to an embodiment of the present disclosure. Some elements have been omitted or simplified for clarity. The MTJ film stack 100 is illustrated to have an ellipses shape in the x-y plane with the long axis of the ellipses parallel to the x-axis. Bottom electrodes 5 are illustrated on either side of the MTJ film stack 100 and are positioned so that a current flowing from one of the bottom electrodes 5 to the other of the bottom electrodes 5 (illustrated by the arrow 92) also flows parallel to the x-axis. Due to the antiferromagnetic arrangement of the synthetic free layer 30, the magnetic moment 94 of FL1 34 may be intrinsically rotated from the x-axis by an angle θ1 between about 5° and about 45°. The magnetic moment 96 of FL2 36 may also be rotated from the x-axis by an angle θ2 which may be between about 5° and about 45°. Due to the offset of magnetic moment 94 and magnetic moment 96 from the x-axis, the current Jc may give a spin orbit torque to switch the synthetic free layer 30 without an external field. The offset magnetic moment 94 and offset magnet moment 96 create x and y components and the y components helps for switching without an external field. Rather than force the rotated magnetic moment by rotation of the MTJ film stack 100, the long axis of the MTJ film stack 100 remains parallel to the x-axis so that no extra lateral space is required to implement the embodiments disclosed herein.

Figure 3:
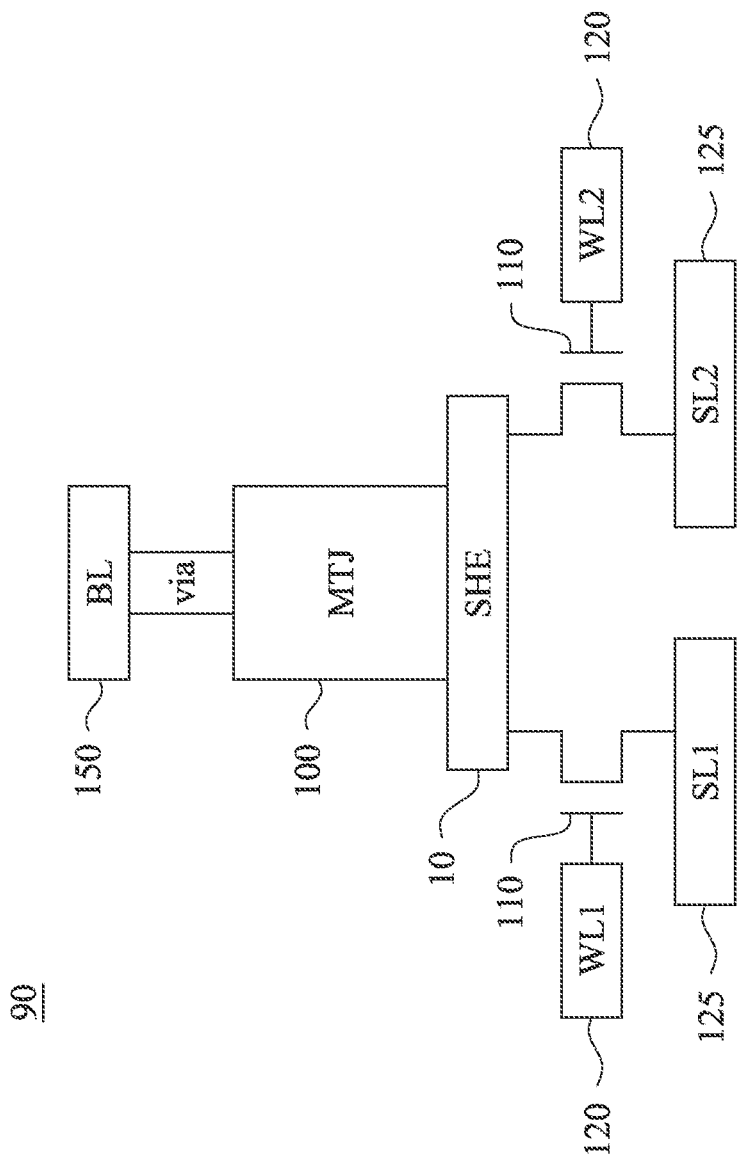

FIG. 3 shows a simplified schematic view of a SOT-MRAM cell 90 according to an embodiment of the present disclosure. Materials, configurations, dimensions, processes, and/or operations described with respect to FIG. 1 using like references may be employed in the following embodiments, and detailed explanation thereof may be omitted.

In some embodiments, the spin Hall electrode 10 is coupled at one end to a switching device (e.g., a field effect transistor (FET)), referred to herein as FET 110. In some embodiments, the spin Hall electrode 10 is coupled to a drain (or source) of the FET 110 (or FETA) through one or more conductive patterns (such as a via, a wiring, conductive lines, and/or a pad), and a gate of the FET is coupled to a word line WL1 120 through one or more conductive patterns. A source (or drain) of the FETA is coupled to a source line SL1 125 through one or more conductive patterns. Another end of the spin Hall electrode 10 is coupled to another switching device (e.g., a field effect transistor (FET)), also referred to herein as FET 110 (or FET2). In some embodiments, the spin Hall electrode 10 is coupled to a drain (or source) of the FET2 through one or more conductive patterns, and a gate of the FET2 is coupled to a word line WL2 120 through one or more conductive patterns. A source (or drain) of the FET2 is coupled to a source line SL2 125 through one or more conductive patterns.

The MTJ film stack 100 is disposed over the spin Hall electrode 10 along the vertical direction (film stack direction) (Z direction). A bit line 160 is electrically coupled to the top of the MTJ film stack 100 through one or more conductive patterns.

In some embodiments, the MTJ film stack 100 may be inverted and the spin Hall electrode 10 may be disposed over the MTJ film stack 100. In such embodiments the capping layer 70 may be omitted and the top electrode 75 (see FIG. 1) may become a bottom electrode 5 and the bottom electrodes 5 may become top electrodes 75. The synthetic free layer 30 of the MTJ film stack 100 may be disposed at a top of the inverted MTJ film stack 100. The wiring arrangement can remain the same, with a drain (or source) of the FET1 FET 110 coupled to the one end of the spin Hall electrode 10 and a drain (or source) of the FET2 FET 110 coupled to the other end of the spin Hall electrode 10 through conductive patterns. Similarly, the bit line 160 may be coupled to the now bottom of the MTJ film stack 100 through one or more conductive patterns. Referring to FIG. 1, inverting the MTJ film stack 100 and placing the spin Hall electrode over the inverted MTJ film stack 100 produces the top electrode 75 now on the bottom; over the top (now bottom) electrode 75 is the AFM layer 60; over the AFM layer 60 is the reference layer structure 50; over the reference layer structure 50 is the barrier layer 40; over the barrier layer 40 is the free layer 30; over the free layer 30 is the spin Hall electrode 10; and over the spin Hall electrode 10 are the bottom (now top) electrodes 5, which are each connected to the FETs 110 at either end of the spin Hall electrode 10.

Using the arrangement of the elements as depicted in FIG. 3, the SOT-MRAM cell 90 may implement an x-type memory element without the need of using an external field to assist switching the synthetic free layer 30 and without rotating the MTJ film stack 100. Additionally, by utilizing SOT-MRAM cells 90 rather than STT-MRAM cells, the power requirements are less so that the transistor sizing of the FETs 110 (FET1 and FET2) can also be reduced. In some embodiments, the area size of the SOT-MRAM device 300 can be about 50% to 75% of the area size of a comparable SRAM device and about the same size as an STT-MRAM device, while requiring less power, providing faster switching, and more robust longevity (an increased number of switching cycles).

If the word line WL1 120 is positive biased and the word line WL2 is positive biased, the gate of FETs 110 (FET1 and FET2) will be turned on. Then current Jc can flow in one direction across the spin Hall electrode 10, inducing the synthetic free layer 30 to change magnetization direction. If the current direction is reversed, then the current Jc can flow in the opposite direction across the spin Hall electrode 10, inducing the synthetic free layer 30 to change magnetization in a reverse direction. If either one of the transistors FETs 110 (FET1 or FET2) is not turned on, however, then current will not flow across the spin Hall electrode 10 and a read operation can be performed through the MTJ film stack 100 at the bit line 160. The reading and writing operation is discussed in greater detail below.

FIGS. 4A, 4B, and 4C illustrate various configurations of the MTJ film stack 100, in accordance with various embodiments. The spin Hall electrode 10 is a spin orbit active layer that causes a strong spin orbit interaction with the synthetic free layer 30.

In FIG. 4A, the spin Hall electrode 10 has a crystalline structure which is fcc, while the barrier layer 40 may have a crystalline structure which is bcc or which may be amorphous. The first layer FL1 32 of the synthetic free layer 30 has a crystalline structure which follows the spin Hall electrode 10. The spacer layer 34 can act as a structural barrier between the crystalline structure of the FL1 32 layer (which follows the crystalline structure of the spin Hall electrode 10) and the FL2 36 layer (which allows the FL2 36 layer to match the crystalline structure of the barrier layer 40). The spacer layer 34 may either be amorphous or may have a crystalline structure which is bcc. Then the FL2 36 layer may have a crystalline structure which is bcc. The barrier layer 40 may be bcc or amorphous, and the reference layer 52 of the reference layer structure 50 may also be bcc. The spacer layer 54 of the reference layer structure may be hcp (for example, if Ru) or fcc (for example, if Ir) and the pinned layer 56 of the reference layer structure 50 may be fcc or bcc. The AFM 60 may be fcc.

The material of the spin Hall electrode 10 may be formed of platinum, palladium, gold, tantalum, tungsten, combinations thereof, or other suitable material, and may be formed to have a thickness between about 3 nm and about 10 nm, though other values are contemplated and may be used. The FL1 32 of the synthetic free layer 30 may be formed of CoFeB, CoFe, FeB, or NiFe and may be between about 0.5 nm and about 2.5 nm, though other values are contemplated and may be used. The spacer layer 34 of the synthetic free layer 30 may be formed of W, Ta, Mo, Cr, the like, or combinations thereof and may have a thickness between about 3 Å and 15 Å (which thickness depends on the materials used and is sized to maintain anti-ferromagnetic coupling between the FL1 32 and FL2 36, as discussed above). The barrier layer 40 may be formed of crystalline magnesium oxide or amorphous aluminum oxide (e.g., AlO$_x$) or other suitable material and may have a thickness between about 0.5 nm and about 1.5 nm. The reference layer 52 of the reference layer structure 50 may, in some embodiments, be formed of a combination of CoFeB, FeB, Co, and CoFe. For example, a layer of CoFeB may contact the barrier layer 40 and a layer of CoFe is formed on the layer of CoFeB and interfaces with the spacer layer 54 of the reference layer structure 50. The layer of CoFeB may be between about 1.5 nm and about 3.5 nm and the layer of CoFe may be between about 0.5 nm and about 1.5 nm, with a total thickness of the reference layer 52 being between about 2 nm and about 5 nm. The spacer layer 54 of the reference structure 50 may be made of Ru or Ir and may have a thickness between about 2 Å and about 15 Å. The pinned layer 56 of the reference layer structure 50 may be made of CoFe or a combination of CoFe and Co and may have a total thickness between about 2 nm and about 4 nm. Although CoFe usually has a bcc crystalline structure, the structure may be influenced to have an fcc crystalline structure by the structure of the overlying AFM layer 60, for example, when the AFM layer 60 is formed of platinum manganese. The AFM layer 60 may be formed of any suitable material, such as platinum manganese, iridium manganese, or iron manganese and may have a thickness between about 10 nm and about 30 nm. The total thickness of the MTJ film stack 100 may be between about 20 nm and about 35 nm.

In FIG. 4B, the spin Hall electrode 10 has a crystalline structure which is bcc and which may match the crystalline structure of the barrier layer 40 (bcc). In some embodiments the barrier layer 40 may be amorphous. The first layer FL1 32 of the synthetic free layer 30 has a crystalline structure which follows the spin Hall electrode 10. The spacer layer 34 may either be amorphous or may have a crystalline structure which is bcc. The FL2 36 layer may have a crystalline structure which is bcc. The barrier layer 40 may be bcc or amorphous, and the reference layer 52 of the reference layer structure 50 may also be bcc. The spacer layer 54 of the reference layer structure 50 may be hcp (for example, if Ru) or fcc (for example, if Ir) and the pinned layer 56 of the reference layer structure 50 may be fcc or bcc. The AFM 60 may be fcc. Because the crystalline structure of the FL1 32 and the FL2 36 may be the same as the crystalline structure of the barrier layer 40, the structure consistency improves the magnetoresistance ratio of the MTJ film stack 100 during read operations.

The magneto resistance ratio (MR ratio) is a ratio equal to the resistance of the antiparallel resistance of the free layer and reference layer combination (Rap) minus the parallel resistance of the free layer and reference layer combination (Rp), all divided by the parallel resistance of the free layer and reference layer combination (Rp). MR ratio=(Rap−Rp)/Rp.

The material of the spin Hall electrode 10 may be formed of tungsten, tantalum, platinum, other suitable materials, or combinations thereof, and may be formed to have a thickness between about 3 nm and about 10 nm, though other values are contemplated and may be used. The remaining layers may be formed using materials and configurations similar to those listed above for the FIG. 4A.

In FIG. 4C, the spacer layer 34 is made of Ru, enhancing the antiferromagnetic coupling between FL1 32 and FL2 36. The greater antiferromagnetic coupling reduces the write current and may therefore use smaller write transistors. Ru may negatively interact with B, however, thereby degrading the antiferromagnetic coupling in the synthetic free layer 30. Thus, in FIG. 4C, the spacer layer 34 is sandwiched between two thin layers of CoFe which are sandwiched between two thin layers of CoFeB. FL1 32 therefore includes a layer of CoFeB (layer 32B) interfacing with the spin Hall electrode 10 and then a layer of CoFe (layer 32A) on the CoFeB which interfaces with the spacer layer 34 of the synthetic free layer 30. The FL2 36 is formed in reverse, with a layer of CoFe (layer 36A) interfacing with the spacer layer 34 and then a layer of CoFeB (layer 36B) on the layer of CoFe. In the FL1 32, the CoFeB layer 32B may have a thickness between about 0.4 nm and 2.4 nm, the CoFe layer 32A may have a thickness between about 0.1 nm and about 0.4 nm, and a total thickness of the FL1 32 may be between about 0.5 nm and about 2.5 nm. In the FL2 36, the CoFe layer 36A may have a thickness between about 0.1 nm and 0.4 nm, the CoFeB layer 36B may have a thickness between about 0.9 nm and about 2.4 nm, and a total thickness of the FL2 36 may be between about 1 nm and about 2.5 nm.

Similar to that described above with respect to FIG. 4A and elsewhere, the barrier layer 40 may be bcc and the reference layer 52 of the reference layer structure 50 may also be bcc. The spacer layer 54 of the reference layer structure 50 may be hcp and the pinned layer 56 of the reference layer structure 50 may be fcc or bcc. The AFM 60 may be fcc.

Still referring to FIG. 4C, the material of the spin Hall electrode 10 may be formed of platinum, tungsten, tantalum, palladium, gold, and may be formed to have a thickness between about 3 nm and about 10 nm, though other values are contemplated and may be used. The remaining layers may be formed using materials and configurations similar to those listed above for the FIG. 4A.

Figure 5:
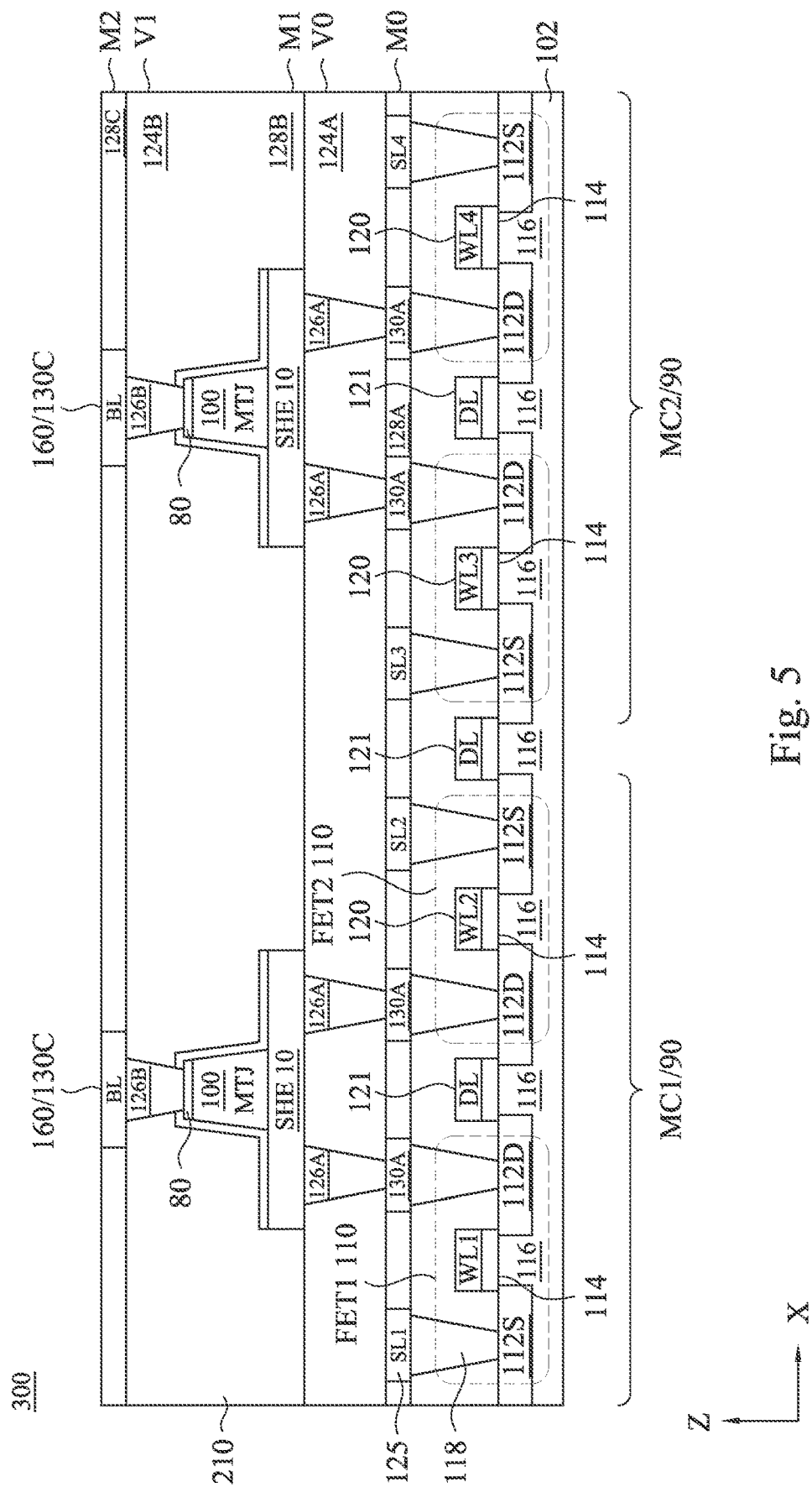
FIG. 5 is a cross-sectional view of an SOT-MRAM device, in accordance with some embodiments.
Figure 21:
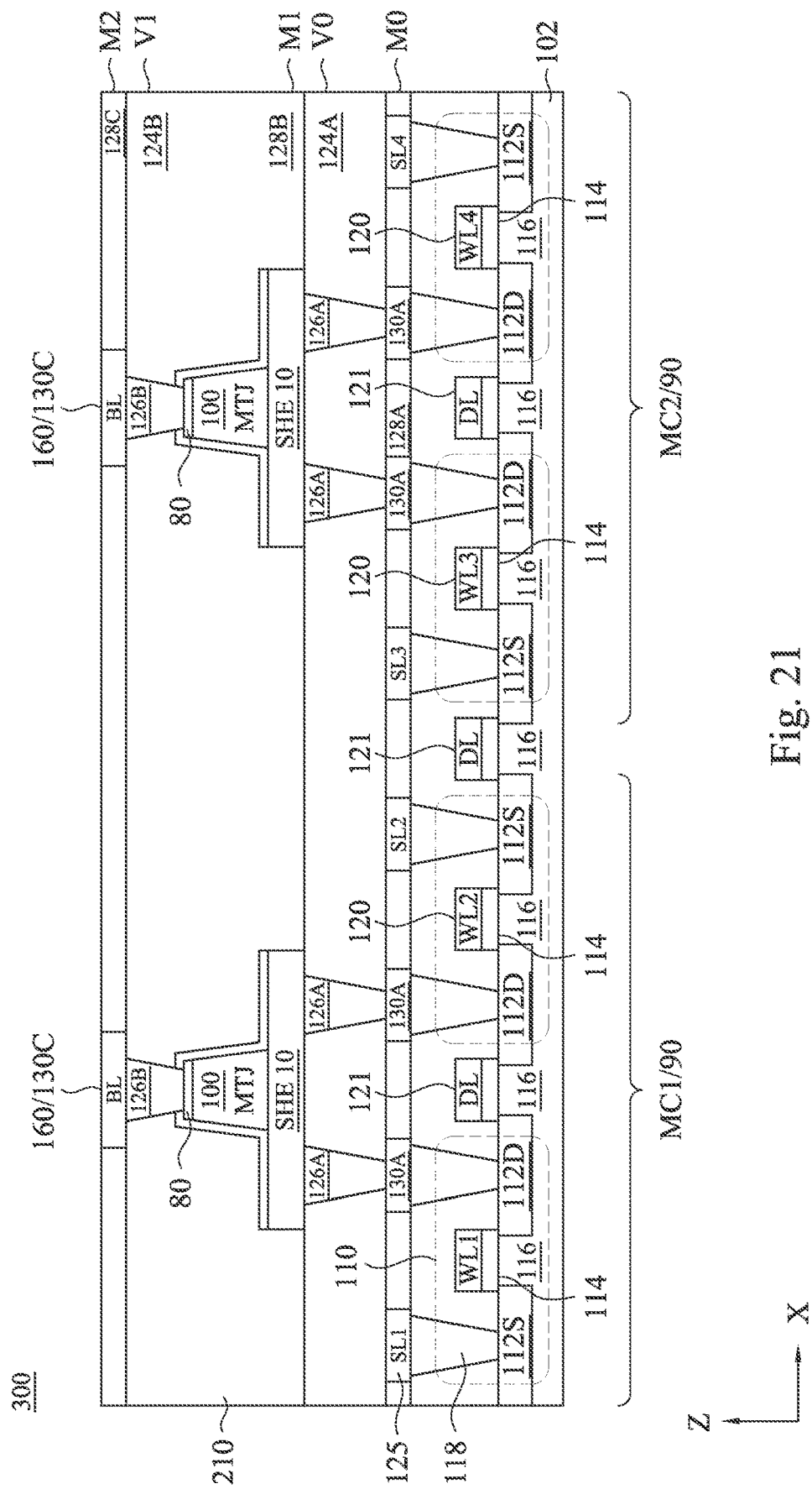
Figure 22:
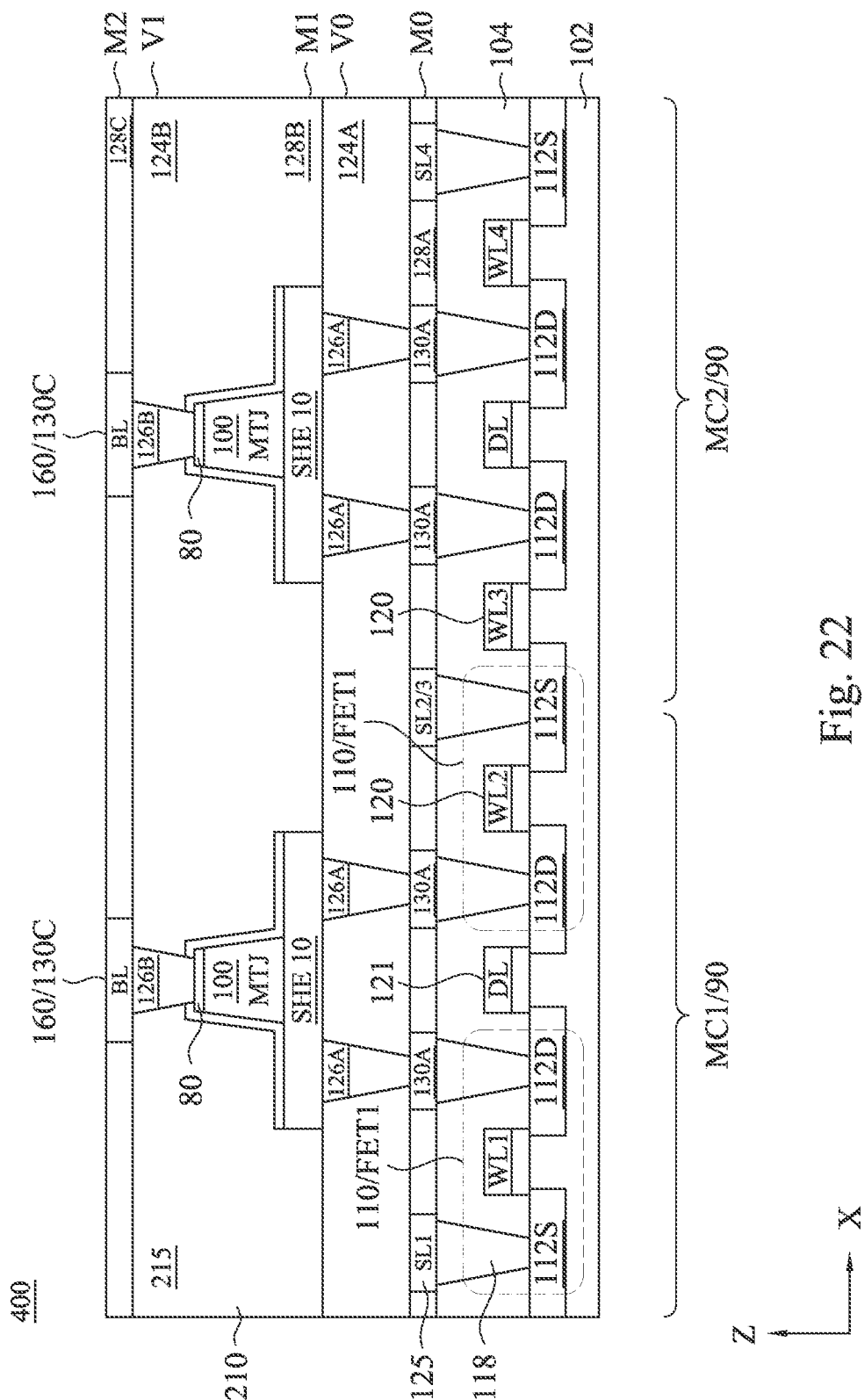
FIG. 22 is a cross-sectional view of an SOT-MRAM device, in accordance with some embodiments.
Figure 23:
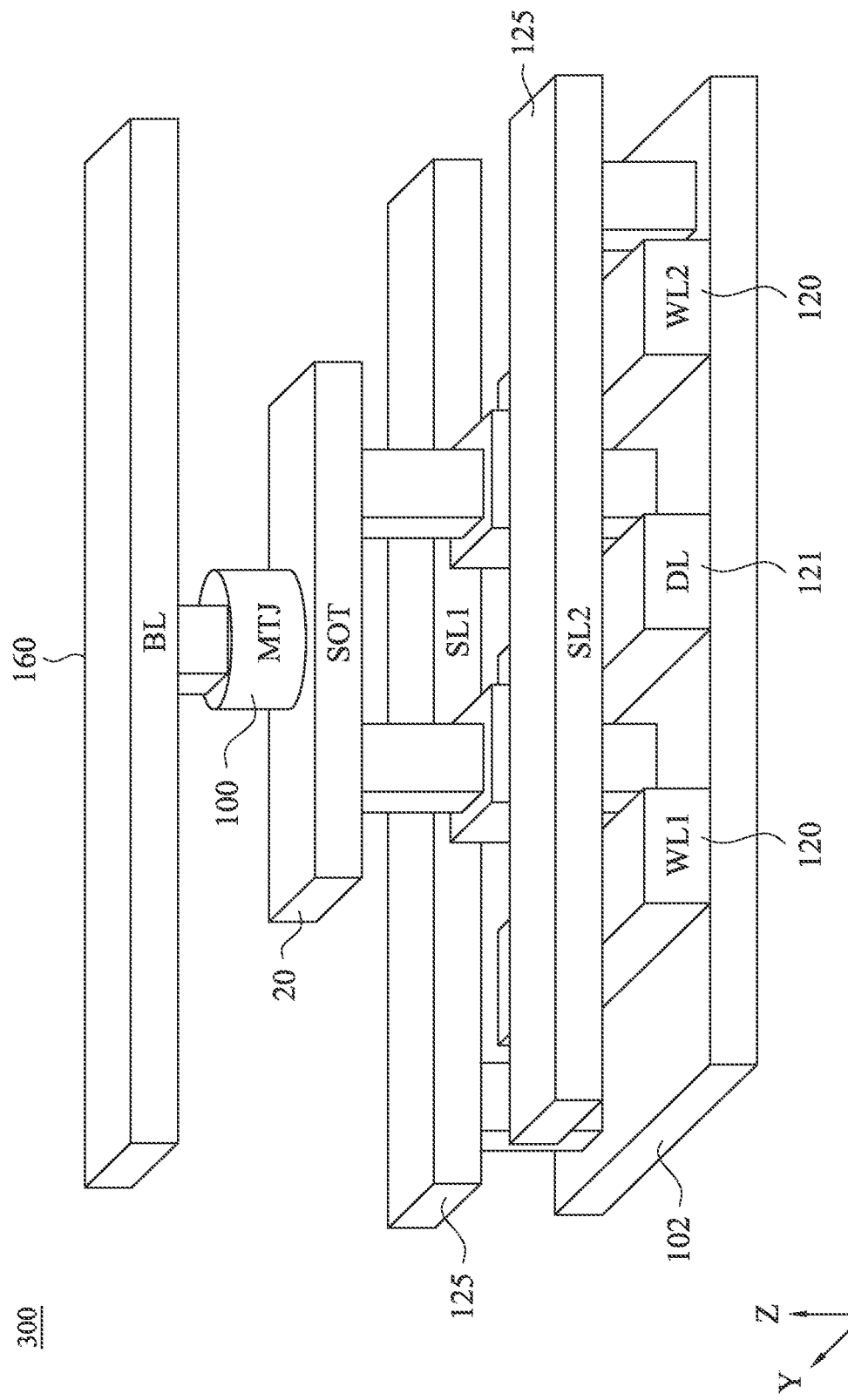
FIG. 23 is a perspective view of an SOT-MRAM device, in accordance with some embodiments.
Figure 24:
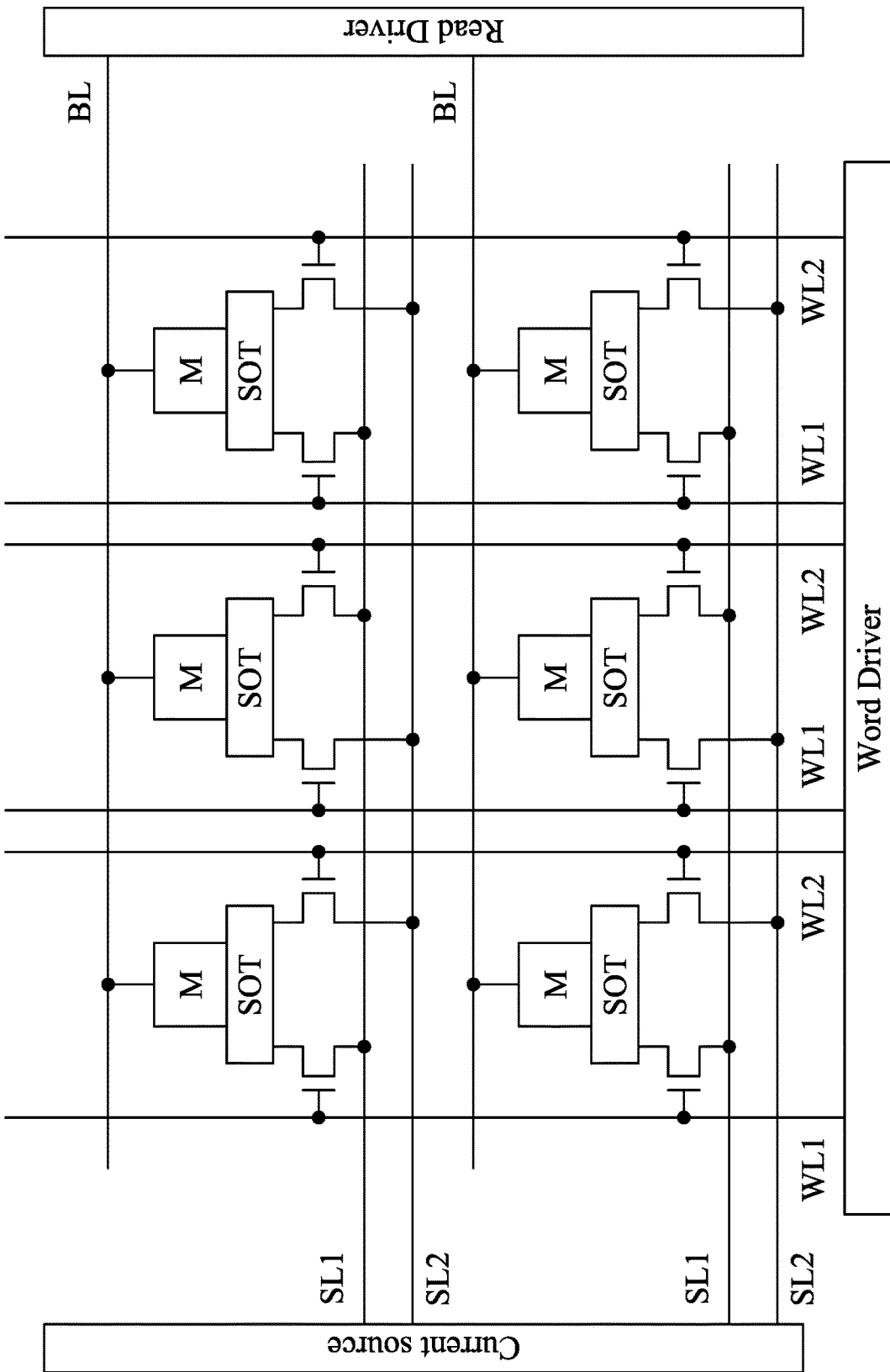
FIG. 24 is a circuit diagram of an SOT-MRAM device according to some embodiments.

FIGS. 5, 21, and 22 are schematic cross-sectional views of a portion of the SOT-MRAM device 300, in accordance with various embodiments. Some aspects of the illustrated layers of the SOT-MRAM device 300 may be flattened into these cross-sectional views and it should be understood that some of the layers may exist in actuality in other cross-sections. FIG. 23 is a three-dimensional representation of the SOT-MRAM devices illustrated in FIGS. 5, 21, and 22. FIG. 24 is a circuit diagram consistent with those embodiments illustrated in FIGS. 5, 21, and 22.

Figure 14:
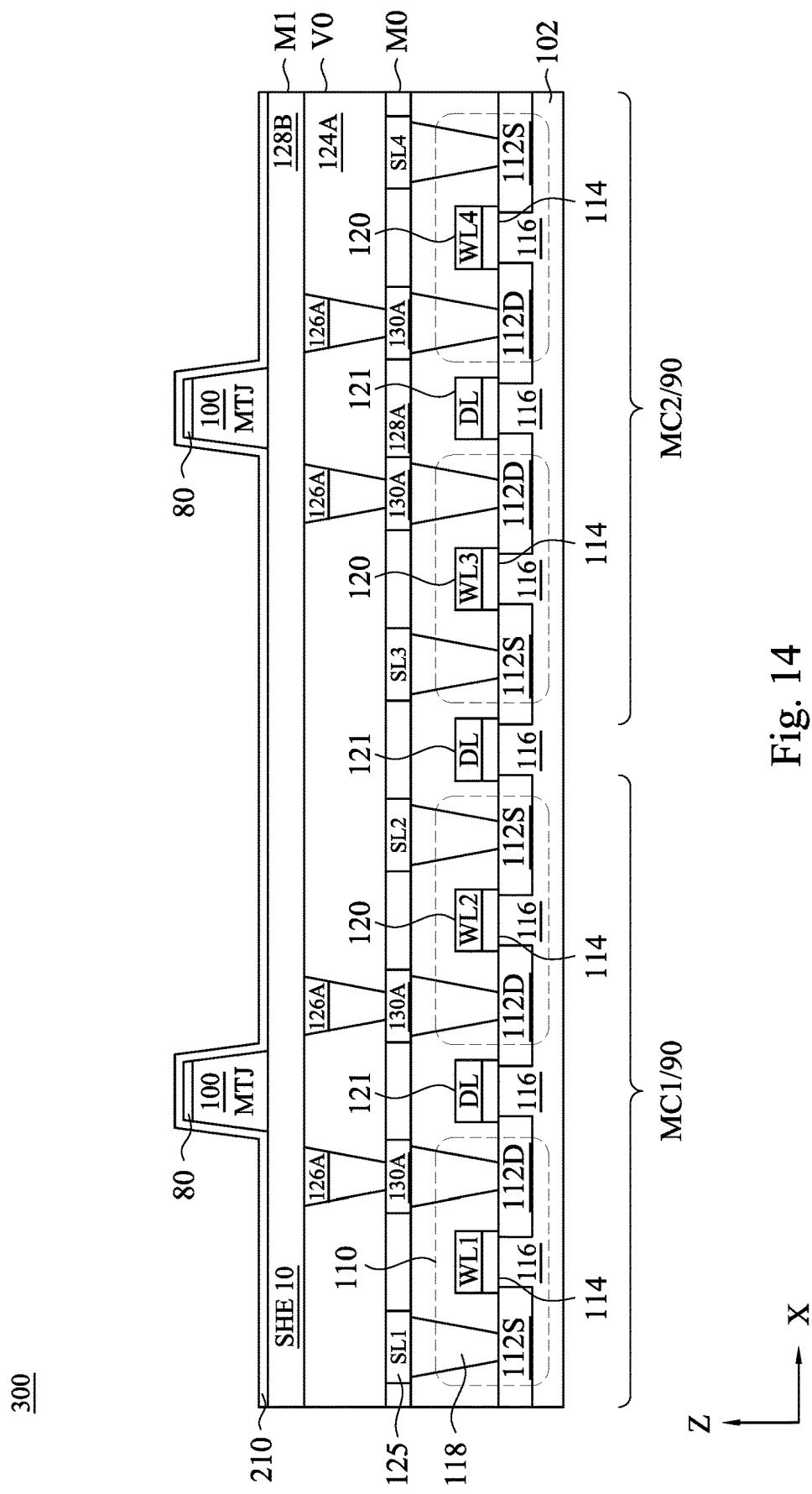
Figure 15:
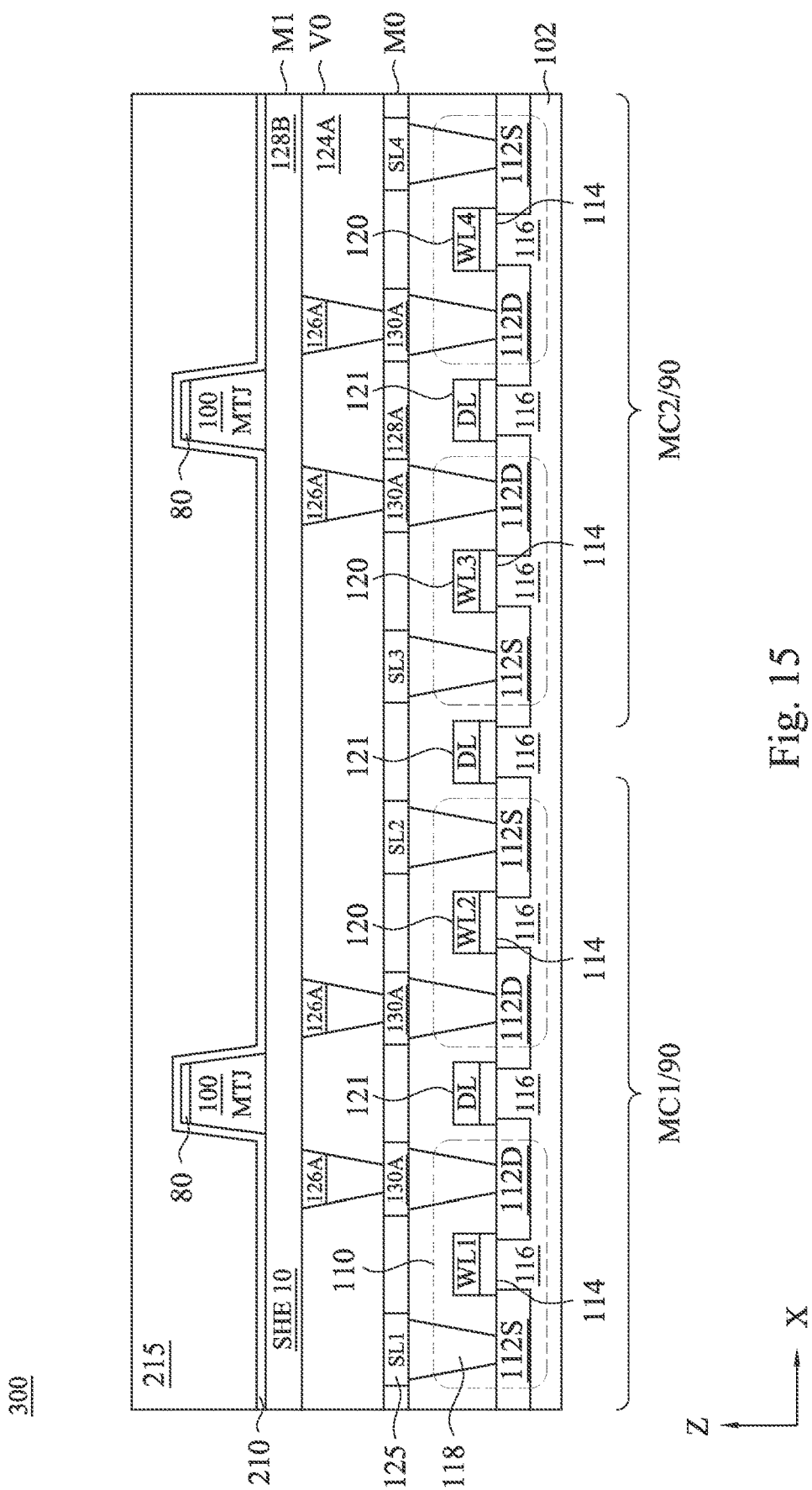

Materials, configurations, dimensions, processes, and/or operations described with respect to FIGS. 1 through 3 may be employed in the following embodiments, and detailed explanation thereof may be omitted. Referring in general to FIGS. 5, 14 and 15, in some embodiments, the SOT-MRAM device includes a layered structure having a multiple wiring layer structure. In some embodiments, the multiple wiring layer structure includes "Mx" (x=0, 1, 2, 3, . . . ) metal wiring layers, which are located at respective levels disposed over a substrate, and "Vy" (y=0, 1, 2, 3, . . . ) vias (contacts) connecting the My metal wiring layer to the My+1 metal wiring layer. The metal wiring layers include metal lines which are embedded in a dielectric material layer. The vias include conductive plugs embedded in an interlayer dielectric (ILD) material which separates adjacent metal wiring layers. For the purpose of illustration and labelling, the elements ending in "A" correspond to the x=0, y=0 levels, the elements ending in "B" correspond to the x=1, y=1 levels, the elements ending in "C" correspond to the x=3, y=3 levels, and so forth. In some embodiments, the even-number metal wiring layers extend in one direction (e.g., X) and the odd-numbered metal wiring layers extend in another direction (e.g., Y) crossing the one direction. In some embodiments, pitches for metal wirings may generally increase as the levels increase. For example, the metal wiring pitches in levels M3 and M4 may be the same and pitches for the metal wirings in M5 or higher may be the same and may be larger than the pitches for the metal wirings in M3 and M4.

In some embodiments, the metal wirings and vias are made of one or more of aluminum, cobalt, copper, a copper alloy, tungsten, titanium, titanium nitride, tantalum, tantalum nitride, alloys thereof, the like, or combinations thereof. The vias may also include barrier or adhesion material layers surrounding the sides of the vias and formed of one or more layers of titanium, titanium nitride, tantalum, tantalum nitride, tungsten nitride, ruthenium, rhodium, platinum, other noble metals, other refractory metals, their nitrides, combinations of these, or the like.

In some embodiments, the ILD layers are formed of any suitable dielectric material including, for example, a nitride such as silicon nitride, an oxide such as silicon oxide, SiOC, and SiOCN, SiCN, phosphosilicate glass (PSG), borosilicate glass (BSG), boron-doped phosphosilicate glass (BPSG), the like, or combinations thereof.

The contact plugs 118 connect a source region 112S or drain region 112D of the FETs 110 to the M0 metal wiring layer (e.g., conductive line 130A) through a dielectric layer 104. The source line SL1 125 is in the M0 metal wiring layer and coupled to the source region 112S of the FET 110 (FET1). The source line SL2 125 is in the M0 metal wiring layer and coupled to the source region 112S of the FET 110 (FET2). The drain region 112D of the FET 110 (FET1) is coupled to one end of the spin Hall electrode 10. The drain region 112D of the FET 110 (FET2) is coupled to the other end of the spin Hall electrode 10. The bit line BL 160 is above the MTJ film stack 100, in the M2 metal wring layer and coupled to the top of the MTJ film stack 100. The word line WL1 is coupled to the gate electrode of the FET 110 (FET1) and the word line WL2 is coupled to the gate electrode of the FET 110 (FET2).

It should also be understood that the schematic in FIG. 5 is only an illustration of one embodiment and changes may be made without departing from the spirit of the disclosure. For example, it should be understood that multiple intervening layers may be included as necessary to accommodate any desired wiring layout. In particular, when a particular element is described as being in a particular metal wiring layer, the disclosure contemplates that any desired number of metal wiring layers may be intervening between the described metal wiring layers. For example, where one element is described as being in the M2 metal wiring layer and another element is described as being in the M3 metal wiring layer, there may be any number of metal wiring layers between the M2 metal wiring layer and the M3 metal wiring layer. Also, as noted above, the MTJ film stack 100 may be formed such that the spin Hall electrode is disposed above the MTJ film stack 100.

In some embodiments, the FETs 110 are planar FETs, fin FETs, or gate-all-around FETs. The electrode 75 is coupled to a drain region 112D of a FET 110 and a source region 112S of the FET 110 is coupled to the source line SL1 125. In some embodiments, the source region 112S is shared by two adjacent FETs 110 (see FIG. 22). In some embodiments, a pair of FETs 110 (FET1 and FET2) are separated by a dummy gate structure 121 from another pair of FETs 110 (e.g., in MC2 of FIG. 5). The word lines WL 120 are coupled to the gates of the FETs 110 and switch whether a current may flow from the source line SL 125 through the MTJ film stack 100 to the bit line BL 160.

Referring to FIG. 5, two SOT-MRAM cells 90 of the SOT-MRAM device 300 are illustrated, including MC1 and MC2. As illustrated in FIG. 5, the source regions 112S of adjacent SOT-MRAM cells 90 may be separated by a dummy gate structure 121, similar to the separation of the drain regions 112D of the FETs 110 (FET1 and FET2) by the dummy gate structure 121. In some embodiments, two of the adjacent SOT-MRAM cells 90 may share a common source region 112S (see, e.g., FIG. 22).

The spin Hall electrode 10 may be disposed in the M1 metal wiring layer and may be coupled to the drain region 112D (or source region) of each of the FETs 110 of MC1. The MTJ film stack 100 may be disposed on the spin Hall electrode 10 in the V1 layer, for example in a bottom portion V1A of the V1 layer. A via 126B may connect the top of the MTJ film stack 100 to the bit line BL 160 in the M2 metal wiring layer. The source line SL1 and the source line SL2 may be disposed in the M0 metal wiring layer and may be coupled to the source region 112S (or drain region) of each of the FETs no (FET1 and FET2, respectively). The word line WL1 and the word line WL2 are respectively connected to the gate electrodes of each of the FETs 110 (FET1 and FET2, respectively). These connections may be brought up into the metal wiring layers by vias and wiring patterns in another cross-section. As illustrated in FIG. 5, the source lines (e.g., SL1 and SL2) are each directed in the Y direction and have a small cross-section along the X direction.

In some embodiments, the MTJ film stacks 100, spin Hall electrode 10, source lines SL 125, and bit lines BL 160 may each move down a metal wiring layer or up one or more metal wiring layers.

FIGS. 6 through 21 illustrate intermediate steps in the formation of the SOT-MRAM device 300 of FIG. 5. The materials which may be used to form the various structures and elements of the SOT-MRAM device 300 are described above and are not repeated.

Figure 6:
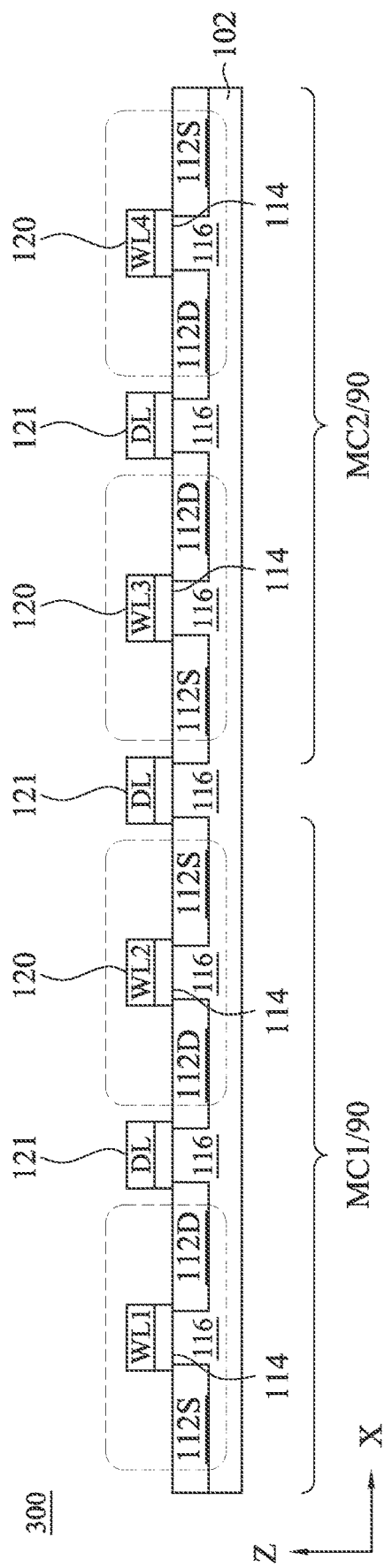
FIGS. 6 through 21 are intermediate steps used in formation of an SOT-MRAM device, in accordance with some embodiments.

FIG. 6 illustrates a cross-sectional view of a substrate 102 and multiple FETs 110 formed on the substrate 102, in accordance with some embodiments. The FETs 110 are part of the subsequently formed SOT-MRAM cells 90 of the SOT-MRAM device 300. Some example FETs 110 are indicated in FIG. 6. The substrate 102 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including silicon germanium (SiGe), GaAsP, AlInAs, AlGaAs, GaInAs, GaInP, and/or GaInAsP; or combinations thereof. Other substrates, such as multi-layered or gradient substrates, may also be used.

In some embodiments, the FETs 110 are Fin Field-Effect Transistors (FinFETs) comprising fins 116, gate structures 114, and source regions 112S and drain regions 112D. As shown in FIG. 6, the fins 116 are formed on the substrate 102 and may comprise the same material as the substrate 102 or a different material. In some embodiments, dummy fins (not shown) may be formed between some fins 116 to improve process uniformity. The gate structures 114 are formed over multiple fins 116 and extend in a direction perpendicular to the fins 116. In some embodiments, spacers (not shown in the Figures) may be disposed on the sidewalls of the gate structures 114. In some embodiments, dummy gate structures 121 may be formed between some gate structures 114 to improve process uniformity. The dummy gate structures 121 may be considered "dummy transistors" or "dummy FinFETs," in some embodiments. Some gate structures 114 are used as Word Lines in the SOT-MRAM device 300

(described in greater detail below), and have been labeled as "WL," such as "WL2," accordingly. The source regions 112S and the drain regions 112D are formed in the fins 116 on either side of the gate structures 114. The source regions 112S and the drain regions 112D may be, for example, implanted regions of the fins 116 or epitaxial material grown in recesses formed in the fins 116. In the embodiment shown in FIG. 6, one side of each fin 116 is adjacent source regions 112S and the other side of each fin 116 is adjacent drain regions 112D.

The FETs 110 shown in the Figures are representative, and some features of the FETs 110 may have been omitted from the Figures for clarity. In other embodiments, the arrangement, configuration, sizes, or shapes of features such as fins 116, dummy fins, gate structures 114, dummy gate structures 21, source regions 112S, drain regions 112D, or other features may be different than shown. In other embodiments, the FETs 110 may be another type of transistor, such as planar transistors.

Figure 7:
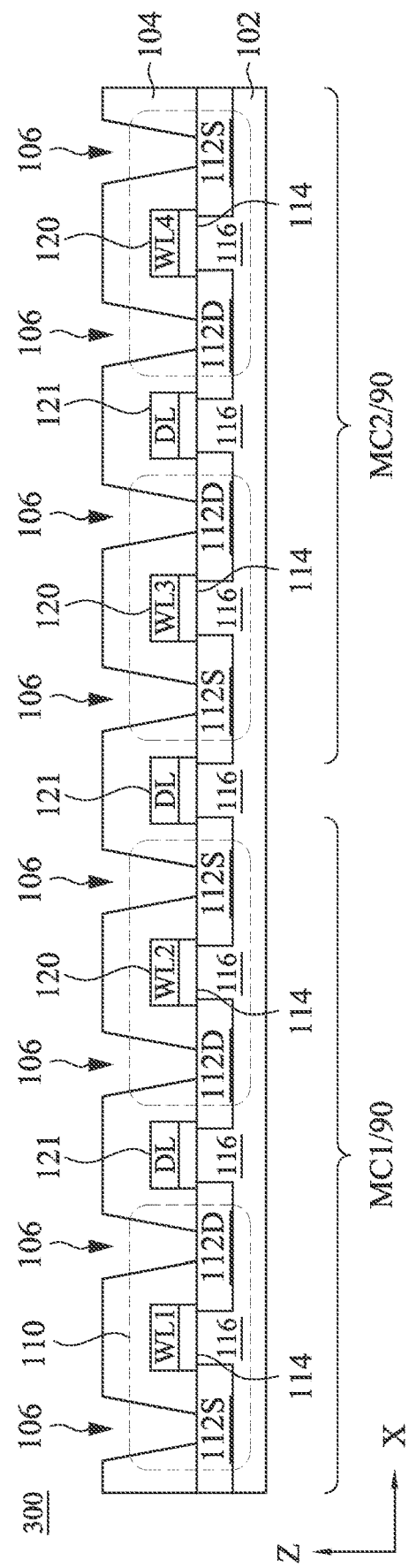

In FIG. 7, a dielectric layer 104 is formed over the substrate 102 and patterned to expose the source regions 112S and drain regions 112D, in accordance with some embodiments. The dielectric layer 104 may cover the FETs 110, and may be considered an Inter-Layer Dielectric layer (ILD) in some embodiments. The dielectric layer 104 may be formed of any suitable dielectric material including, for example, any of the materials listed above for an ILD. The dielectric layer 104 may be formed using any acceptable deposition process, such as spin coating, physical vapor deposition (PVD), chemical vapor deposition (CVD), the like, or a combination thereof. In some embodiments, the dielectric layer 104 may be a low-k dielectric material, such as a dielectric material having a dielectric constant (k value) lower than about 3.0, for example.

The dielectric layer 104 may be patterned to form openings 106 that expose the source regions 112S and the drain regions 112D for subsequent formation of contact plugs 118 (see FIG. 3). The dielectric layer 104 may be patterned using a suitable photolithography and etching process. For example, a photoresist structure (not shown) may be formed over the dielectric layer 104 and patterned. The openings 106 may be formed by etching the dielectric layer 104 using the patterned photoresist structure as an etching mask. The dielectric layer 104 may be etching using a suitable anisotropic etching process, such as a wet etching process or a dry etching process.

Figure 8:
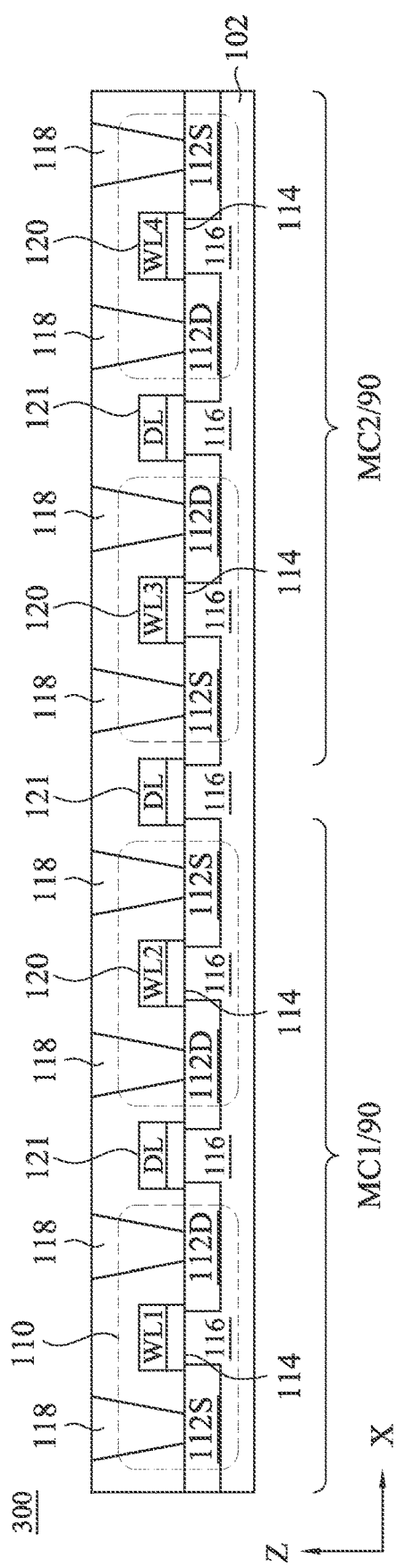

Turning to FIG. 8, contact plugs 118 are formed to make electrical connection to the source regions 112S and the drain regions 112D, in accordance with some embodiments. In some embodiments, the contact plugs 118 are formed by depositing a barrier layer (not individually shown) extending into the openings 106, depositing a conductive material over the barrier layer, and performing a planarization process such as a Chemical Mechanical Polish (CMP) process or a grinding process to remove excess portions of the blanket conductive barrier layer and the conductive material. The barrier layer or the conductive material of the contact plugs 118 may be formed using a suitable process such as Chemical Vapor Deposition (CVD), Physical Vapor Deposition (PVD), Atomic Layer Deposition (ALD), plating, or the like. The barrier layer, if used, may be formed of any suitable material, such as TiN, Ti, TaN, Ta, the like, or combinations thereof.

Figure 9:
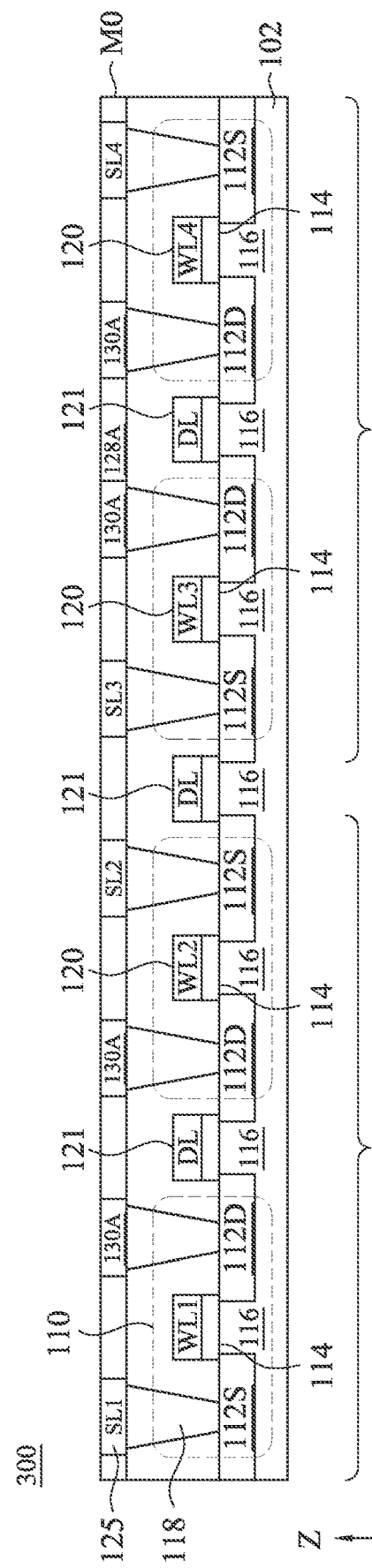

Turning to FIG. 9, conductive lines 130A are formed to electrically connect the contact plugs 118 and provide electrical routing within the SOT-MRAM device. The conductive lines 130A may be formed within a dielectric layer 128A that is formed over the dielectric layer 104. The dielectric layer 128A may be a material similar to those described above for dielectric layer 104 (see FIG. 7), and may be deposited using similar techniques as dielectric layer 104. The dielectric layer 128A may be considered an Inter-Metal Dielectric layer (IMD) in some embodiments.

The conductive lines 130A may be formed using a suitable technique such as damascene, dual-damascene, plating, deposition, the like, or combinations thereof. In some embodiments, the conductive lines 130A are formed by first depositing the dielectric layer 128A and patterning the dielectric layer 128A to form openings (e.g., using a suitable photolithography and etching process), and then filling the openings in the dielectric layer 128A with conductive material. For example, the conductive lines 130A may be formed by depositing an optional blanket barrier layer (not individually shown) over the patterned dielectric layer 128A, depositing a conductive material over the blanket barrier layer, and performing a planarization process such as a CMP process or a grinding process to remove excess portions of the blanket conductive barrier layer and the conductive material. The barrier layer or the conductive material may be similar to those described above for the contact plugs 118 (see FIG. 8), and may be deposited using similar techniques. In some embodiments, the conductive material of the contact plugs 118 and the conductive lines 130A may be deposited in the same step, for example, if a dual-damascene process is used to form the contact plugs 118 and the conductive lines 130A.

In some embodiments, the conductive lines 130A are formed by first depositing the optional blanket barrier layer over the dielectric layer 104 and contact plugs 118, depositing a conductive material over the blanket barrier layer, and then patterning the barrier layer and conductive material (e.g., using a suitable photolithography and etching process) to form the conductive lines 130A. The dielectric layer 128A may be deposited over the conductive lines 130A and a planarization process performed to expose the conductive lines 130A.

Figure 10:
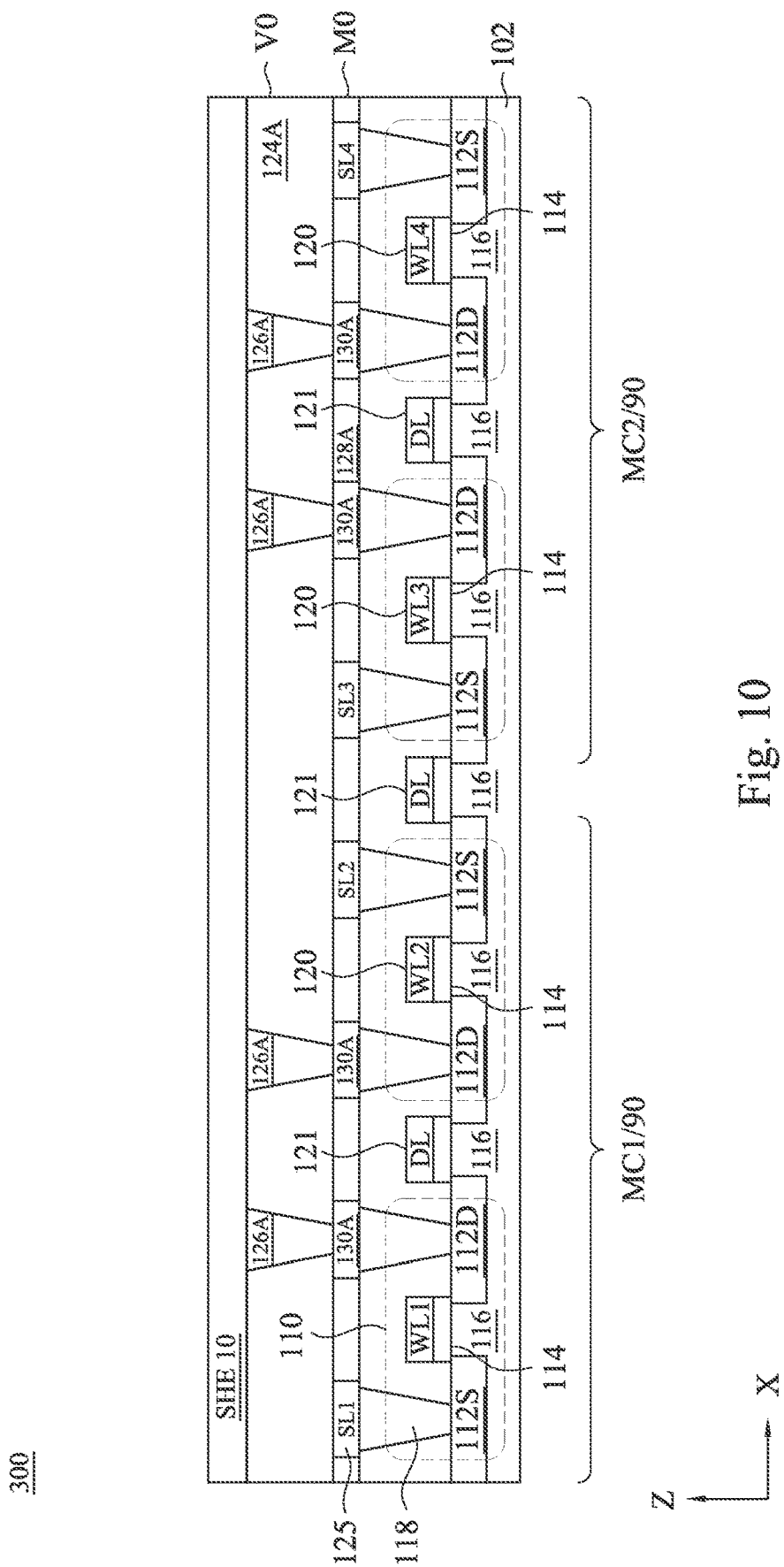

In FIG. 10, vias 126A are formed within a dielectric layer 124A to make electrical connection to the conductive lines 130A, in accordance with some embodiments. In some embodiments, the dielectric layer 124A is first formed over the conductive lines 130A and the dielectric layer 128A. The dielectric layer 124A may be a material similar to those described above for the dielectric layer 104 and the vias 126A may be formed using processes and materials similar to those described above with regard to the contact plugs 118. In some embodiments, the vias 126A may be formed using a single damascene process and may be a Cu, W, or TiN plug. In some embodiments, the vias 126A may serve as the bottom electrode 5 (see FIG. 1). An optional barrier layer may also be used, as discussed above with respect to the contact plugs 118 to prevent diffusion of the material of the contact plugs 118 to the surrounding dielectric layer 124A. In some embodiments, additional wiring layers are included between the M0 layer and the V0 layer represents the layer immediately below the subsequently formed SHE 10. The process of forming conductive lines and vias are repeated to form a desired number of metal wiring layers.

As illustrated in FIG. 10, after forming the vias 126A, the spin Hall electrode 10 may be formed. In some embodiments, the vias 126A may serve as the bottom electrode 5 (shown in other Figures, e.g., FIG. 1). In some embodiments, the buffer layer 7 (see FIG. 1) may be formed over the vias 126A using any suitable process, such as by CVD, PVD, the like, and combinations thereof. In embodiments utilizing a buffer layer, the buffer layer may include MgO or the like deposited to a thickness between about 0.2 and 0.9 nm. The bottom electrodes 5 may also be formed using the techniques discussed above with respect to the formation of the conductive lines 130A.

After forming the buffer layer 7 (if used), the spin Hall electrode 10 may be formed. The spin Hall electrode 10 is formed using processes and materials such as those discussed above with respect to FIG. 1. In some embodiments, after the spin Hall electrode 10 is deposited, the MTJ film stack 100 is deposited sequentially, as discussed below, without breaking vacuum throughout the deposition processes of depositing the optional buffer layer 7, the spin Hall electrode 10, and the MTJ film stack 100.

Figure 11:
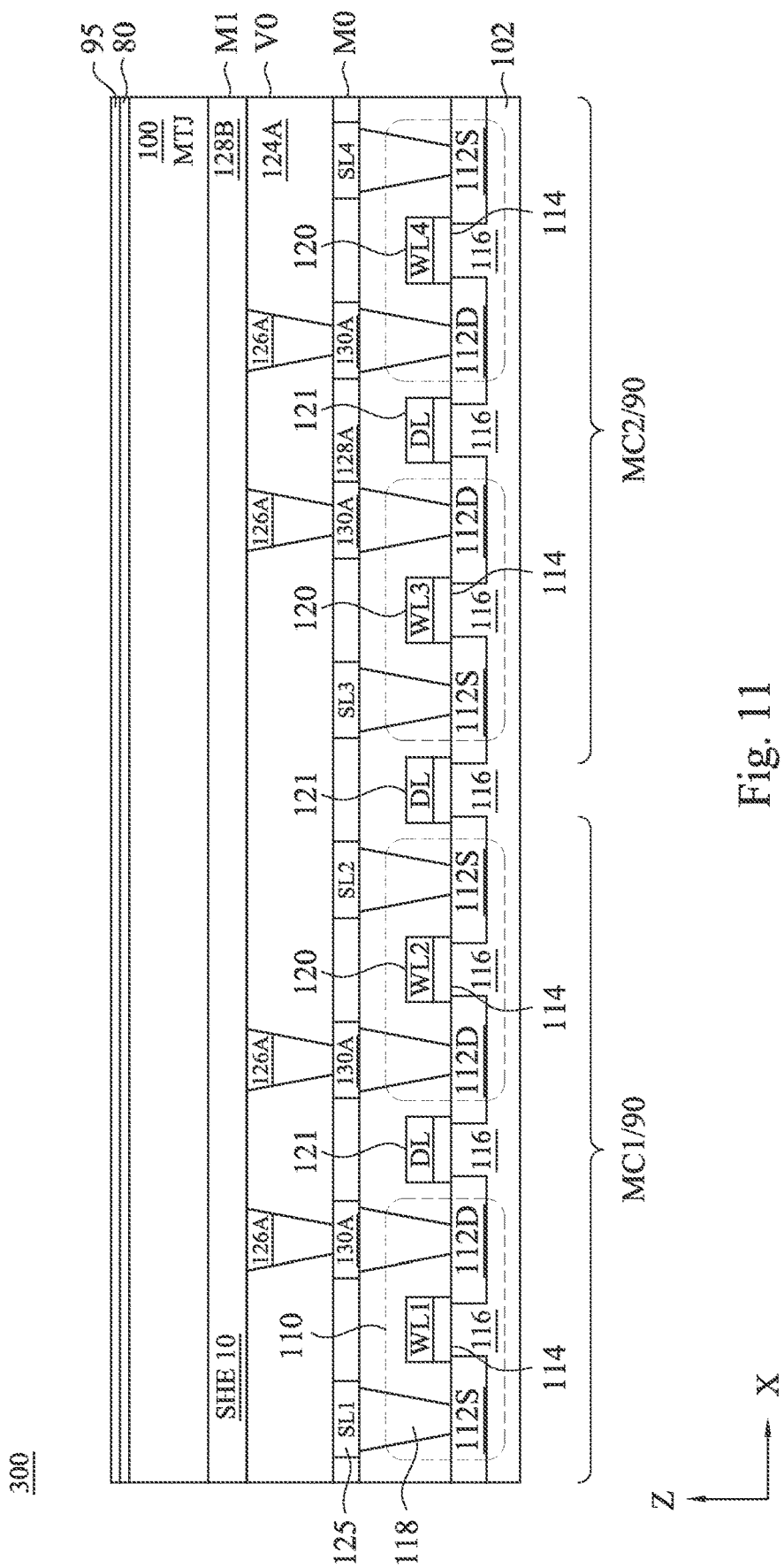

Referring to FIG. 11, the MTJ film stack 100 be deposited, in sequential layers, such as indicated in FIG. 1 according to the embodiments illustrated in FIGS. 4A, 4B, and 4C. Layers for the MTJ film stack 100 are formed over the spin Hall electrode 10, including the synthetic free layer 30, the barrier layer 40, the reference layer structure 50, and the AFM layer 60. The layer 80, which may include the capping layer 70 and top electrode 75 (see FIG. 1) may be formed next. In some embodiments, the top electrode 75 may be formed as part of the hard mask layer 95. In some embodiments, the hard mask layer 95 may include a composite film stack including a metal layer and dielectric layer over the metal layer. The hard mask layer may be deposited using any suitable process and may be made of any suitable material, such as silicon nitride, or a conductive metal layer, such as tantalum, tungsten, titanium nitride, the like, or combinations thereof, such as a first layer of a conductive metal and a second layer of a dielectric, such as silicon nitride. When the hard mask layer 95 is used in shaping the MTJ film stack 100, as described below, the dielectric layer of the hard mask layer 95 may be mostly consumed and the remaining metal layer may serve as the top electrode 75. Each of the layers of the MTJ film stack 100, layer 80, and hard mask layers 95 can be formed by suitable film formation methods, which include physical vapor deposition (PVD) including sputtering; molecular beam epitaxy (MBE); pulsed laser deposition (PLD); atomic layer deposition (ALD); electron beam (e-beam) epitaxy; chemical vapor deposition (CVD); or derivative CVD processes further comprising low pressure CVD (LPCVD), ultrahigh vacuum CVD (UHVCVD), reduced pressure CVD (RPCVD); electro plating, or any combinations thereof.

Figure 12:
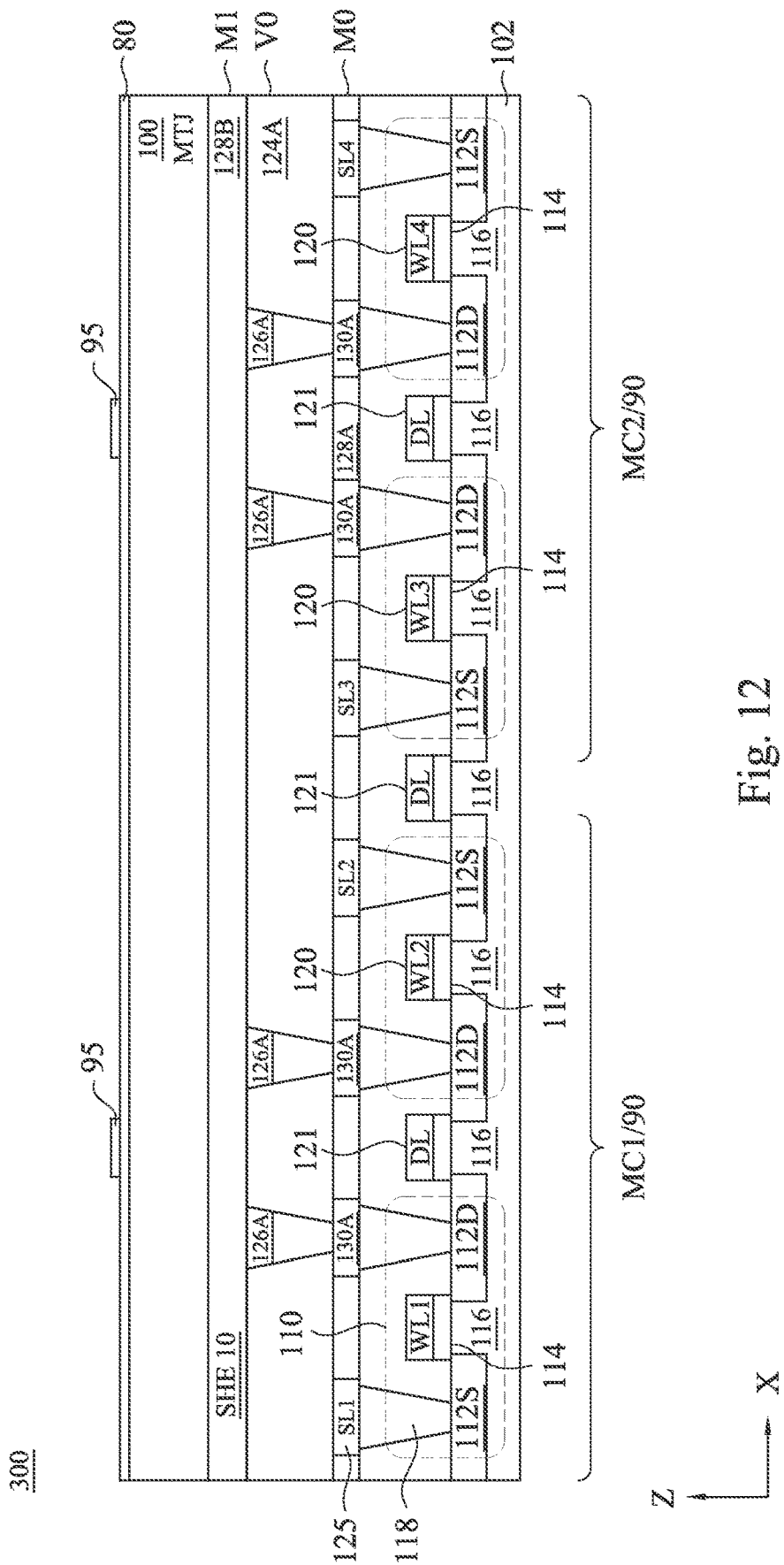

Referring to FIG. 12, the hard mask layer 95 is patterned to protect areas of the SOT-MRAM device 300 where the pillars of the MTJ film stack 100 are to be formed. The patterning may be done by any suitable process, such as by a photolithographic process.

Figure 13:
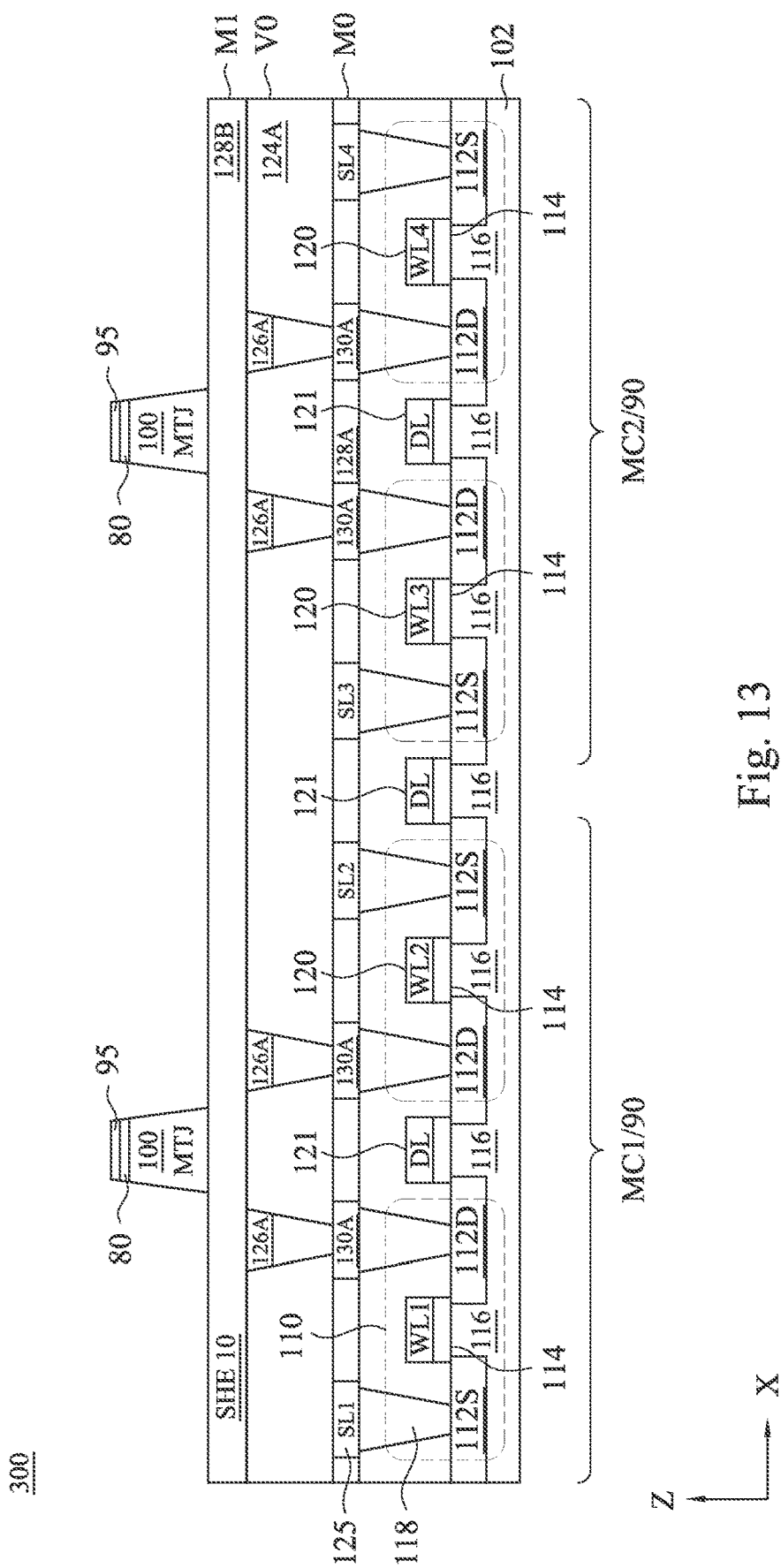

FIG. 13 illustrates the SOT-MRAM device 300 following the patterning of the MTJ film stacks 100. The MTJ film stacks 100 may be patterned by any suitable process, such as by using a dry etch process, such as by reactive ion etching (RIE) and/or by ion-beam etching (IBE), to etch through each successive layer with suitable etchants. All or part of the hard mask layer 95 may be removed through the etching process or by a subsequent removal process in some embodiments. As noted above, in some embodiments, a dielectric layer may be completely or mostly consumed during etching while an underlying metal layer may remain to serve as the top electrode 75 or as part of the top electrode 75. In some embodiments, such as where the hard mask layer 95 is a metal layer, the hard mask layer 95 may remain following the etching process and may be preserved in the final device structure. Following the patterning of the MTJ film stacks 100, each of the MTJ film stacks 100 may have a tapered shape or mesa shape in cross section. Also, as indicated in FIG. 2, each of the MTJ film stacks 100 may have an elliptical shape in top down view which has a long axis which is parallel to the x-axis and parallel to the direction of current flow in the spin Hall electrode 10. Patterning the MTJ film stacks 100 with its long axis parallel to the x-axis allows for a greater memory density than if the MTJ film stacks 100 were rotated about the z-axis.

However, because the MTJ film stack 100 utilizes a synthetic free layer 30, the natural magnetic moment of the synthetic free layer 30 is rotated about the z-axis such that it is askew of the x-axis, which is parallel to the direction of current flow through the spin Hall electrode 10. As noted above, this happens without the need to rotate the MTJ film stacks 100. Due to the skewed magnetic moment, the switch of the synthetic free layer 30 can be accomplished by spin orbit torque only and without requirement of external field.

In FIG. 14, a conformal insulating layer 210 is deposited to encapsulate the patterned MTJ film stacks 100 and over the spin Hall electrode 10. The conformal insulating layer 210 may be formed of any suitable insulating material, such as a nitride such as silicon nitride, silicon carbide, the like, or combinations thereof. The conformal insulating layer 210 may be formed by any suitable deposition process, such as physical vapor deposition (PVD) including sputtering; molecular beam epitaxy (MBE); pulsed laser deposition (PLD); atomic layer deposition (ALD); electron beam (e-beam) epitaxy; chemical vapor deposition (CVD), and so forth.

In FIG. 15, a mask 215 may next be deposited over the spin Hall electrode 10 and over the MTJ film stacks 100. The mask 215 may include any suitable photosensitive materials and may be deposited using any suitable process, including by spin coat or another process. In some embodiments, the mask 215 may include non-photosensitive materials and may be patterned by a separately formed photo mask over the mask 215 which is used to etch the mask 215.

Figure 16:
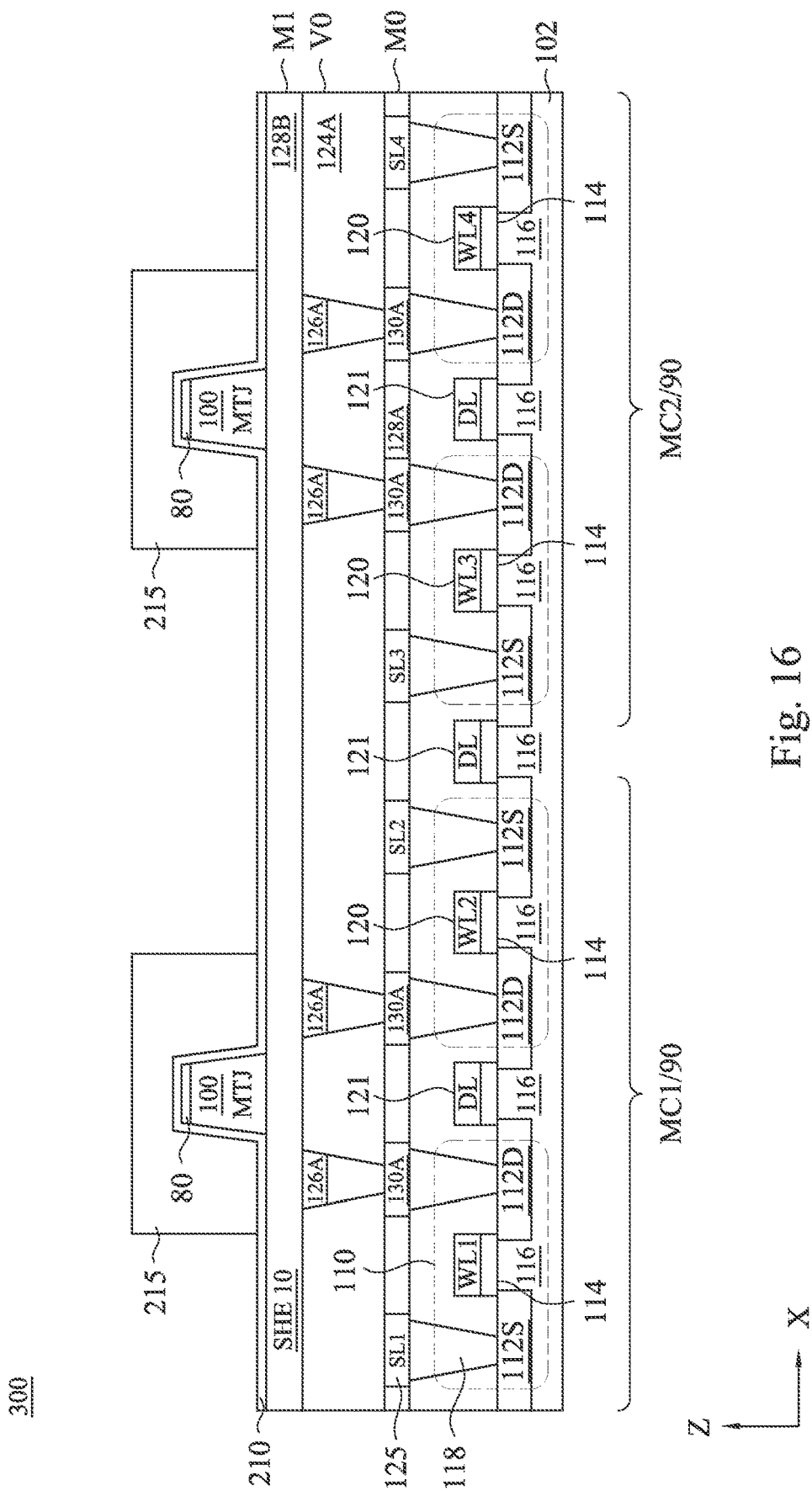

In FIG. 16, the mask 215 is patterned to protect an area of the spin Hall electrode 10 which is to remain. The mask 215 may be patterned using acceptable photo patterning techniques, either applied to the mask 215 itself, or to a separate overlying mask which is then used to etch the mask 215.

Figure 17:
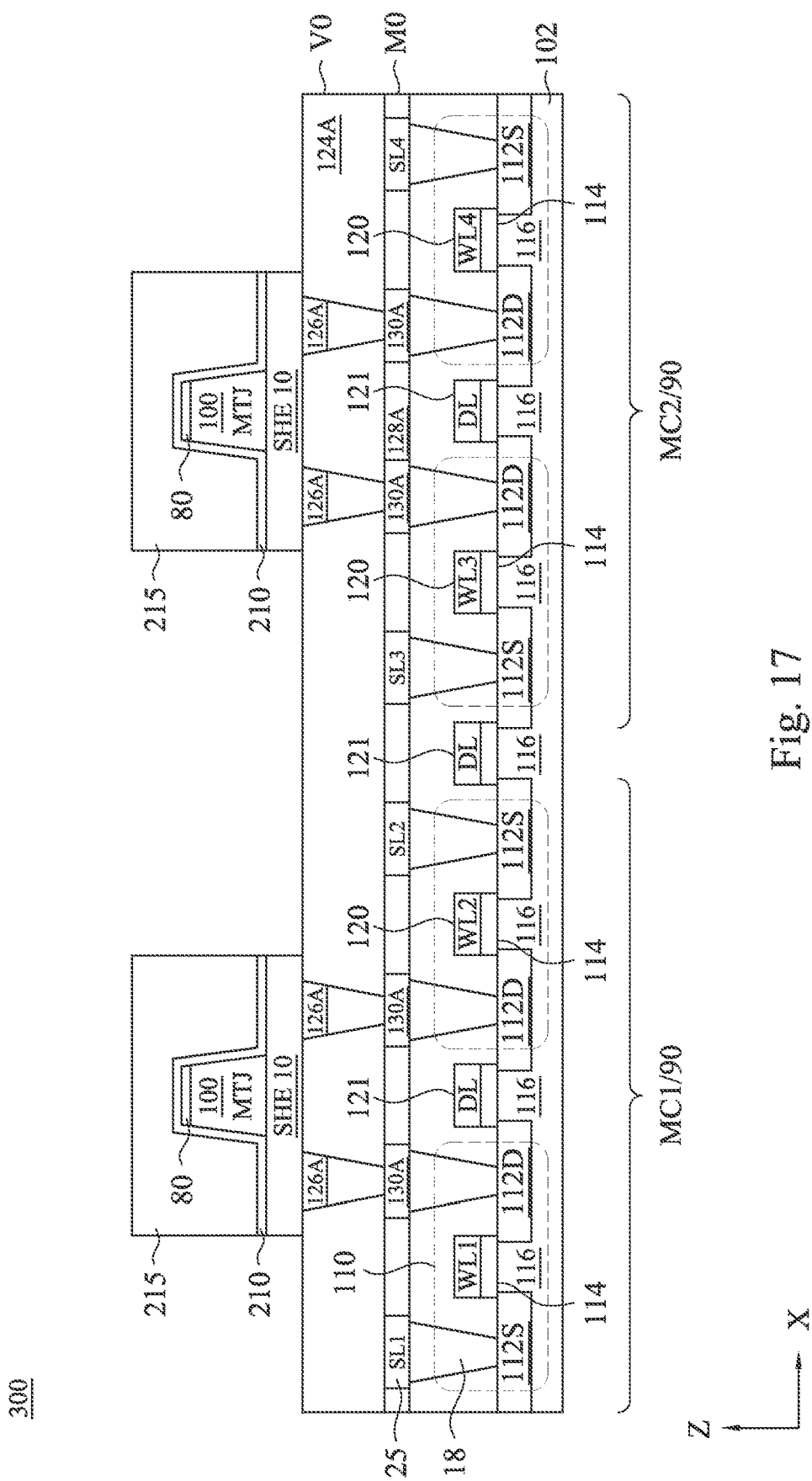

In FIG. 17, the insulating layer 210 and spin Hall electrode 10 are etched to form the shape and structure of the spin Hall electrode 10. The spin Hall electrode 10 may be patterned by any suitable process, such as by using a dry etch process to etch through each successive layer with suitable etchants. The buffer layer 7 (if used) may also be etched using the mask 215 so that the buffer layer 7 has the same shape and foot print as the spin Hall electrode 10.

In some embodiments an anneal may be performed, for example, before or after patterning the MTJ film stack 100 and spin Hall electrode 10. The anneal may be performed at a temperature between about 350° C. and about 425° C., though other values may be used. In addition, the anneal may be performed under a vacuum between about 1e-7 Torr and about 1e-6 Torr and optionally in the presence of a magnetic field. For example, the anneal may be performed in an in-situ in-plane (horizontal) magnetic field of about 0.5 Tesla to about 5 Tesla to set the AFM 60.

Figure 18:
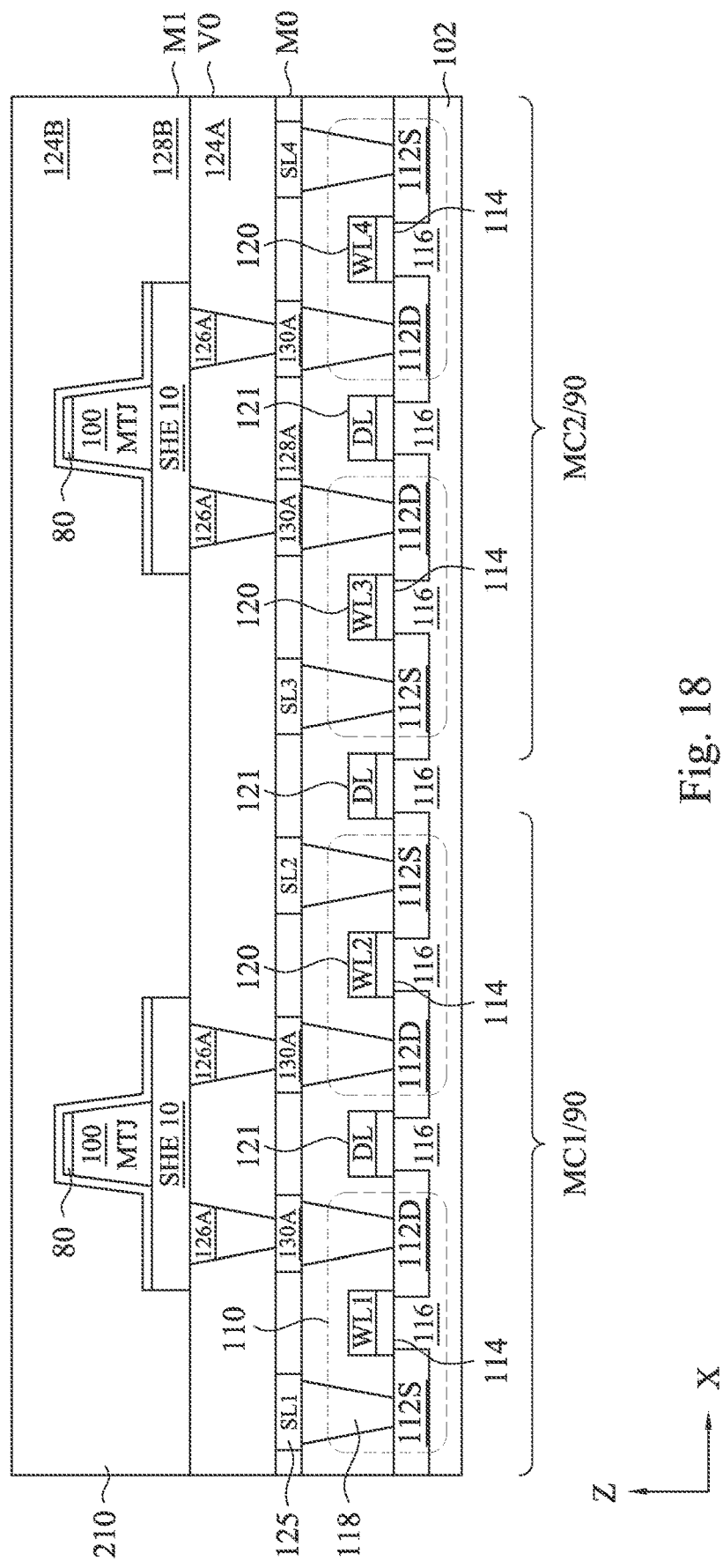

In FIG. 18, the mask 215 is removed after patterning the spin Hall electrode 10. The mask 215 may be removed, for example, by an ashing process or by a wet etch. Next, the ILD 128B is deposited. The ILD 128B may be deposited over and surrounding the spin Hall electrodes 10 and the MTJ film stacks 100. In the illustrated embodiment, an upper portion of the ILD 128B is designated the ILD 124B or an additional ILD layer, ILD 124B, may be deposited in a separate process. The ILD 124B may be flattened by a planarization process, such as by a CMP process after deposition to remove projections of the MTJ film stacks 100 which may be in the upper surface of the ILD 124B after deposition.

Figure 19:
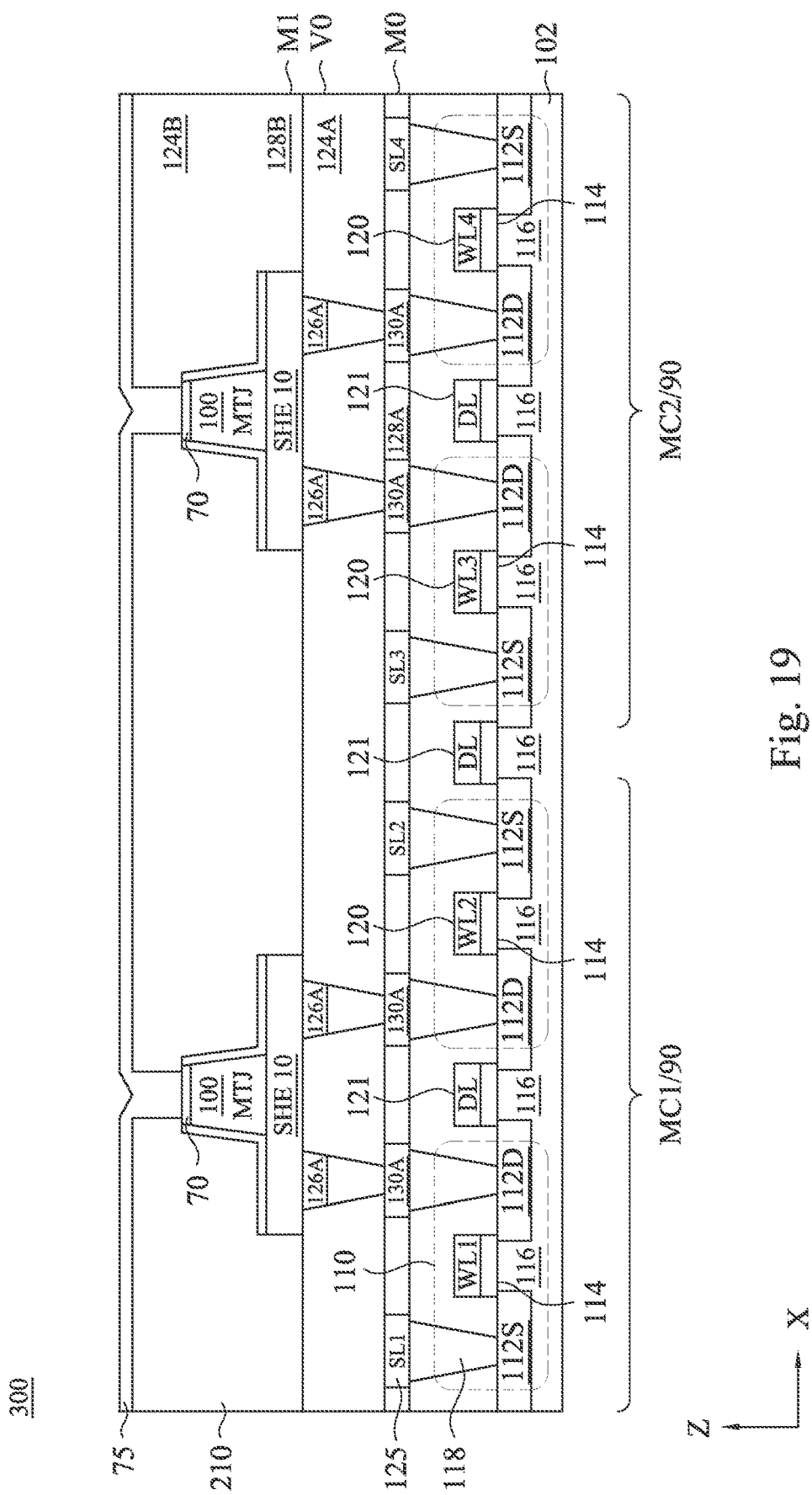
Figure 20:
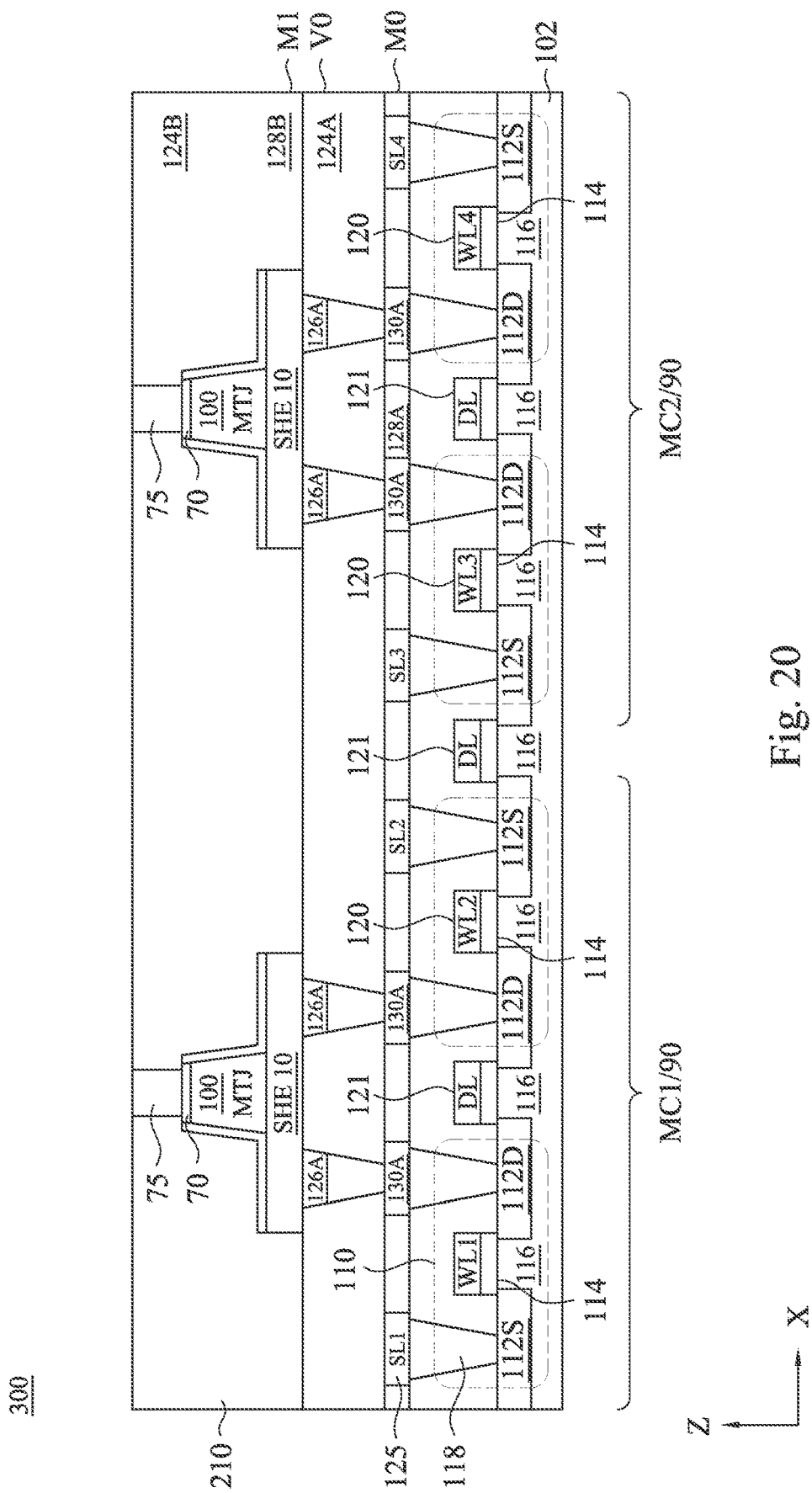

An alternative process is illustrated in FIGS. 19 through 20, in accordance with some embodiments. In the illustrated process, the layer 80 is only the capping layer 70 and has been relabeled as such. A separate top electrode 75 is formed in the illustrated process. Openings may be formed in the ILD 124B and a top electrode 75 metal deposited in the openings. In some embodiments, the top electrode 75 may be a single metal layer and in other embodiments the top electrode may be a multi-layer structure, such as indicated above. In some embodiments, the top electrode 75 may utilize a TiN plug, W plug, or single damascene formed Cu plug. The top electrode 75 may be deposited by any suitable process, such as by physical vapor deposition (PVD) including sputtering; molecular beam epitaxy (MBE); pulsed laser deposition (PLD); atomic layer deposition (ALD); electron beam (e-beam) epitaxy; chemical vapor deposition (CVD), and so forth. In FIG. 20, the top electrode 75 metal is planarized to level an upper surface of the top electrode 75 with an upper surface of the ILD 124B.

FIG. 21 illustrates an embodiment which follows from the process flow of FIG. 18, however, it should be understood that the additional illustrated features of FIG. 21 and on may be integrated into the embodiments illustrated by FIGS. 19 and 20, for example by depositing an additional ILD 124B layer and proceeding accordingly. After forming the ILD 124B, additional vias (e.g., vias 126B in FIG. 21) through the ILD 124B may be formed as necessary to electrically couple to the top of the MTJ film stacks 100 using processes similar to those described above for the contact plugs 118, for example. In some embodiments, the vias 126B may contact the top electrodes 75 (which may be formed as part of the hard mask 95) while in other embodiments, the vias 126B may be utilized as a portion of the top electrode 75, however, the vias 126B do not extend through the capping layer 70 which remains in place as a protection to the MTJ film stack 100.

In FIG. 21, conductive lines 130C are formed to electrically connect the vias 126B and provide electrical routing within the SOT-MRAM device 300 to the bit lines 160. The conductive lines 130C may be formed within a dielectric layer 128C that is formed over the ILD 124B. The dielectric layer 128C may be a material similar to those described above for dielectric layer 104, and may be deposited using similar techniques as dielectric layer 104. The dielectric layer 128C may be considered an Inter-Metal Dielectric layer (IMD) in some embodiments.

FIG. 22 illustrates an embodiment of an SOT-MRAM device 400 where the source region 112S of adjacent FETs 110 is shared between two SOT-MRAM cells 90, such as MC1 and MC2. Sharing the source line SL (e.g., SL2/3 as illustrated) and source regions 112S allows for greater device density. The SOT-MRAM device 400 may be formed using processes and materials similar to those used to form the SOT-MRAM device 300.

FIG. 23 illustrates a three-dimensional view of an of SOT-MRAM cell 90, e.g., MC1, of the SOT-MRAM device 300 of FIG. 21, in accordance with some embodiments. Materials, configurations, dimensions, processes, and/or operations described with respect to FIGS. 1 through 21 may be employed in the following embodiments, and detailed explanation thereof may be omitted.

In some embodiments, word lines 120 (coupled to a gate of FET 110) extend in the Y-direction and the source lines 125 SL1 and SL2 extend in the X-direction. The spin Hall electrode 10 is located above the source or drain regions of two adjacent FETs 110 and is coupled at either end to the respective source or drain regions of the two adjacent FETs 110 by vias and metal wiring layers. The spin Hall electrode 10 may have a direction which is predominantly in the X-direction, in some embodiments.

As shown in FIG. 23, the MTJ film stack 100 is disposed over the spin Hall electrode 10. The MTJ film stack 100 may have a rounded elliptical pillar or elongated cylindrical shape, which may taper as illustrated in other Figures. The bit line 160 is electrically coupled to the top of the MTJ film stack 100 by a via and/or top electrode of the MTJ film stack 100 and may extend in the X-direction.

FIG. 24 is a portion of a circuit diagram of an SOT-MRAM device consistent with the SOT-MRAM device 300, in accordance with some embodiments. Materials, configurations, dimensions, processes, and/or operations described with respect to FIGS. 1-21 may be utilized in the following embodiments, and detailed explanation thereof may be omitted.

In some embodiments, bit lines BL and source lines SL1/SL2, both groups extend in a row direction, and word lines WL1/WL2 extend in a column direction. SOT-MRAM cells are disposed at locations defined by a bit line BL, two word lines WL1/WL2, and two source lines SL1/SL2, in some embodiments. The number of memory cells coupled to the same word lines and/or the same bit lines is not limited to three or four and can be more than 3, e.g., 4, 8, 16, 32, 64, 128, 256, 512 or 1024 or more. The word lines WL1/WL2 are coupled to a word driver circuit (row decoder), the source lines SL1/SL2 (a bundle of N lines represented by a single line) are coupled to a current source circuit which also functions as a write driver circuit in conjunction with the word driver circuit. One end of the spin Hall electrode 10 is coupled to a source or drain of a FET 110, and the other end of spin Hall electrode 10 is coupled to another source or drain of a FET 110. One end of the MTJ film stack M is coupled to the spin Hall electrode 10 between the two connections to the FETs 110 to control current flow direction. The other end of the MTJ film stack M is coupled to a corresponding bit line BL. The gates of the FETs 110 are coupled to the word lines WL1/WL2 and the drain or source of the corresponding FETs 110 are coupled to source lines SL1/SL2.

In the embodiment of FIG. 24, vertically adjacent SOT-MRAM cells along the column direction are coupled to the same word lines WL1/WL2. Horizontally adjacent SOT-MRAM cells along the row direction are coupled to the same bit lines BL and individual source lines SL1/SL2. In some embodiments, adjacent FETs 110 in neighboring SOT-MRAM cells along the row direction share the same source lines SL1 and SL2.

Figure 25:
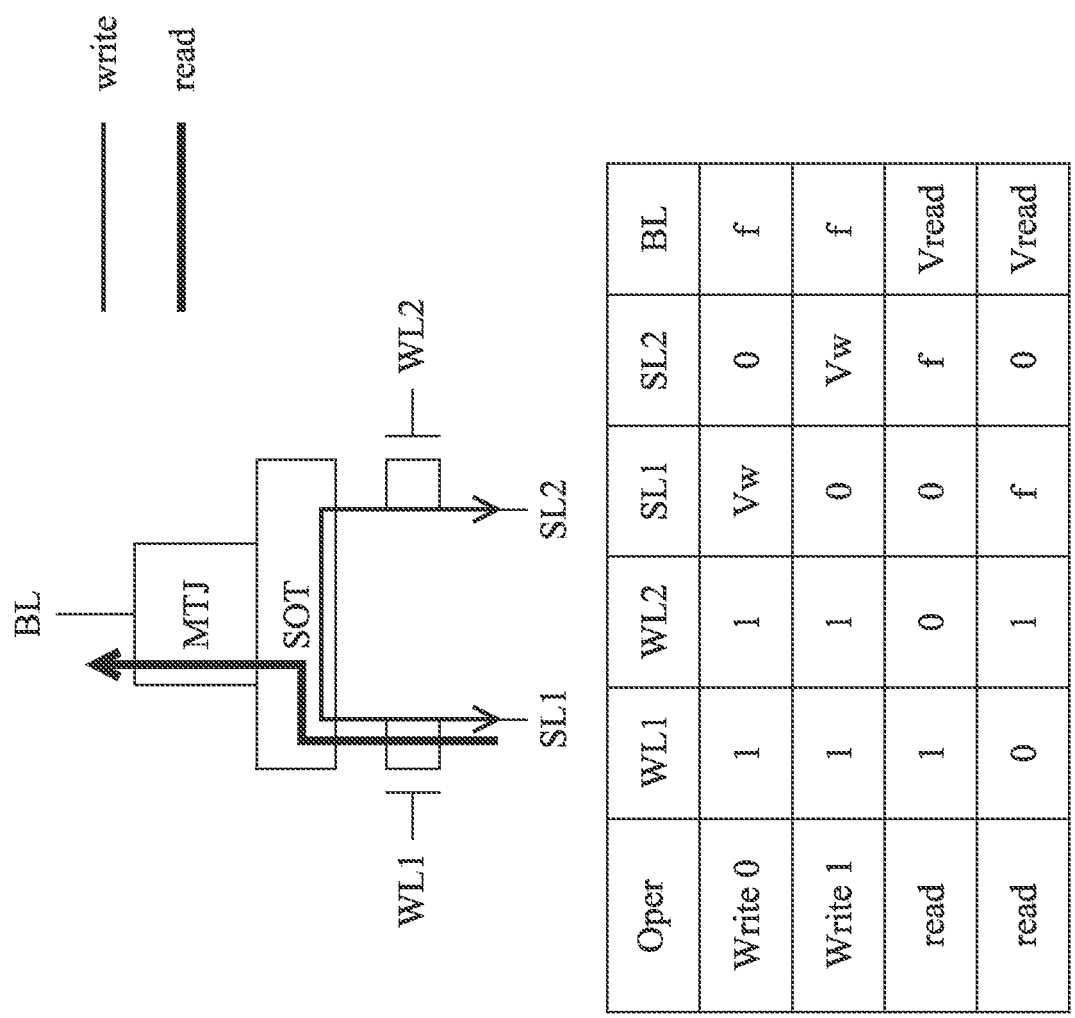
FIG. 25 illustrates operations of an SOT-MRAM cell according to some embodiments.

FIG. 25 shows operations of an SOT-MRAM cell according to an embodiment of the present disclosure. In a writing operation, a write current flows through the spin Hall electrode 10. When writing a first type of data (e.g., "0") to the MTJ film stack 100, the word line WL1 and the word line WL2 are set to turn on the gate electrodes of the FETs 110. The first source line SL1 is set to a first potential (e.g., write voltage "Vw") and the second source line SL2 is set to a second potential (e.g., ground or 0 V), the first potential greater than the second potential. The bit line BL can be floating ("f"). Electrons flowing in the spin Hall metal of the spin Hall electrode 10 have a positive spin Hall angle and induce SOT on the synthetic free layer 30 to cause the spin characteristics of the electrons of the synthetic free layer 30 to change.

When writing a second type of data (e.g., "1") to the MTJ film stack 100, the word line WL1 and the word line WL2 are set to turn on the gate electrodes of the FETs 110. The first source line SL1 is set to the second potential (e.g., ground or 0 V) and the second source line SL2 is set to the first potential (e.g., write voltage "Vw"), the first potential greater than the second potential. The bit line BL can be floating ("f"). Electrons flowing in the spin Hall metal of the spin Hall electrode 10 in the reverse direction have a negative spin Hall angle and induce SOT on the synthetic free layer 30 to cause the spin characteristics of the electrons of the synthetic free layer 30 to change.

When reading data from the MTJ film stack 100, the read operation can be done in several different ways. Either one of the word lines WL1 or WL2 switches on the corresponding FET 110 while the other is off. The SL1 or SL2 connected to the off gate can be floating ("f"), while the SL1 or SL2 connected to the on gate is coupled to a current source. The potential Vread at the bit line BL can be used to calculate the resistance of the spin Hall electrode 10 and MTJ film stack 100, thereby determining whether the MTJ is set to a "1" state or a "0" state. The amplitude of Vread is about 1/10 to about 1/30 of Vw in some embodiments. In other embodiments, the read current flows opposite, from the bit line BL to the source line SL1 or SL2 from the MTJ film stack 100 to the spin Hall electrode 10, in other words, from the read bit line BL to the source line SL. In such a case, the Vread is higher than the source line voltage (e.g., Vread is positive).

Embodiments advantageously utilize a synthetic free layer of an SOT-MRAM device which is configured to be antiferromagnetic and provide a magnetic moment which is not aligned with (i.e., tilted) the direction of current through the underlying spin Hall metal. As such, a spin orbit torque may be used to switch the free layer without external assistant field so that the resistance through the MTJ film stack may be switched between states. Embodiments utilize crystalline structure and spacer materials to achieve anti-ferromagnetic effects while also enhancing magnetoresistance ratio of the MTJ film stack. As such, an x-type of SOT-MRAM device may be provided which does not need a rotated MTJ film stack and which uses less current for operating.

One embodiment is a magnetic memory device including a spin Hall electrode (SHE), the SHE may include a spin Hall metal. The magnetic memory device also includes a magnetic tunnel junction (MTJ) stack disposed over the SHE, the MTJ may include a synthetic anti-ferromagnetic free layer interfacing with the SHE. The synthetic anti-ferromagnetic free layer may include a first magnetic layer, a second magnetic layer, and a spacer layer interposed between the first magnetic layer and the second magnetic layer. The device also includes a first conductive line coupled to a first end of the SHE. The device also includes a second conductive line coupled to a second end SHE. In an embodiment, the magnetic memory device where the SHE may include tungsten, platinum, or tantalum, and the spacer layer may include tungsten at a thickness between 4 Å and 8 Å. In an embodiment, the first magnetic layer and the second magnetic layer are in a synthetic anti-ferromagnetic configuration. In an embodiment, a crystalline structure of a barrier layer of the MTJ stack matches a crystalline structure of the SHE. In an embodiment, the spacer layer is configured to block a crystalline structure of the first magnetic layer from propagating to the second magnetic layer, where the crystalline structure of the first magnetic layer is different from a crystalline structure of the second magnetic layer. In an embodiment, the spacer layer may include ruthenium, tungsten, tantalum, molybdenum, or chromium. In an embodiment, the spacer layer may include ruthenium and the first magnetic layer may include a first sub-layer of CoFe interfacing with the spacer layer and second sub-layer of CoFeB interfacing with the SHE. In an embodiment, the MTJ stack has an elliptical shape in top down view and a long axis of the MTJ stack is parallel to a direction of current flow between the first end of the SHE and the second end of the SHE. In an embodiment, the synthetic anti-ferromagnetic free layer has a default magnetic moment which is tilted from the long axis of the MTJ stack.

Another embodiment is a magnetic memory device including a spin Hall electrode (SHE). The magnetic memory device also includes a top-pinned magnetic tunnel junction (MTJ) stack disposed over the SHE, the MTJ stack may include: a spacer layer interposed between a first free layer of the MTJ stack and a second free layer of the MTJ stack, the first free layer and the second layer magnetically coupled by an anti-ferromagnetic configuration, a reference layer structure disposed over the second free layer, the reference layer structure may include a synthetic anti-ferromagnetic configuration, and a barrier layer interposed between the second free layer and the reference layer structure. In an embodiment, the MTJ stack has an elongated shape, where an axis of the MTJ stack is parallel to a current flow direction through the SHE. In an embodiment, the first free layer and the second free layer have magnetic moments which have a non-zero x-component and a non-zero y-component. In an embodiment, a thickness of the spacer layer is configured to cause the first free layer and the second free layer to be in the anti-ferromagnetic configuration, the thickness being between 4 Å and 8 Å. In an embodiment, the magnetic memory device may include: a first conductive line coupled to a first end of the SHE, the first conductive line coupled to a source/drain of a first transistor; and a second conductive line coupled to a second end of the SHE, the second conductive line coupled to a source/drain of a second transistor. In an embodiment, the MTJ stack further may include an anti-ferromagnetic layer over the reference layer stack. In an embodiment, the reference layer structure includes a reference layer adjacent the barrier layer, a pinned layer, and a second spacer layer interposed between the reference layer and the pinned layer, in which the reference layer structure is in an anti-ferromagnetic configuration. In an embodiment, the first free layer may include a first layer of CoFeB interfacing the SHE and a second layer of CoFe interfacing the spacer layer, the spacer layer may include ruthenium.

Another embodiment is a method including depositing a spin Hall metal layer over an interlayer dielectric of an interconnect. The method also includes depositing a series of layers of a magnetic tunnel junction (MTJ) film stack, the depositing including: depositing a synthetic anti-ferromagnetic free layer structure over the spin Hall metal, depositing a barrier layer over the free layer structure, and depositing a reference layer structure over the barrier layer. The MTJ film stack is patterned into at least one MTJ pillar. The spin Hall metal layer is patterned into a spin Hall electrode for each of the at least one MTJ pillars. In an embodiment, depositing the synthetic anti-ferromagnetic free layer may include: depositing a first magnetic material layer on the spin Hall metal layer; depositing a spacer layer on the first magnetic material layer; and depositing a second magnetic material layer on the spacer layer, where the spacer layer has a first thickness, the first thickness causing the first magnetic material layer and second magnetic material layer to be anti-ferromagnetic. In an embodiment, depositing the first magnetic material layer may include depositing the first magnetic material layer to have a first crystalline structure, where depositing the second magnetic material layer may include depositing the second magnetic material layer to have a second crystalline structure different from the first crystalline structure. In an embodiment, depositing the spin Hall metal layer may include depositing the spin Hall metal layer to have a first crystalline structure, where depositing the barrier layer may include depositing the barrier layer to have a second crystalline structure different from the first crystalline structure. In an embodiment, the method may include: providing a current from a first end of the spin Hall electrode to a second end of the spin Hall electrode, the current causing a spin-orbit interaction in the spin Hall electrode to induce a corresponding spin orbit torque in a free magnetic layer structure, the spin orbit torque causing a magnetic moment of the free magnetic layer structure to change from a first state to a second state, the first state corresponding to a magnetic moment of the free magnetic layer structure which is skewed from a direction of a flow of the current.

One general aspect includes a spin hall electrode (SHE), the she may include a spin hall metal. The magnetic memory device also includes a magnetic tunnel junction (MTJ) stack disposed over the she, the MTJ may include a synthetic anti-ferromagnetic free layer interfacing with the she, the synthetic anti-ferromagnetic free layer may include a first magnetic layer, a second magnetic layer, and a spacer layer interposed between the first magnetic layer and the second magnetic layer. The device also includes a first conductive line coupled to a first end of the she. The device also includes and a second conductive line coupled to a second end of the she.

One general aspect includes a spin hall electrode (SHE). The magnetic memory device also includes and a top-pinned magnetic tunnel junction (MTJ) stack disposed over the she, the MTJ stack may include: a spacer layer interposed between a first free layer of the MTJ stack and a second free layer of the MTJ stack, the first free layer and the second free layer magnetically coupled by an anti-ferromagnetic configuration, a reference layer structure disposed over the second free layer, and a barrier layer interposed between the second free layer and the reference layer structure.

One general aspect includes a spin hall metal layer over an interlayer dielectric of an interconnect structure. The device also includes a magnetic tunnel junction (MTJ) film stack, including a synthetic anti-ferromagnetic free layer structure over the spin hall metal layer, a barrier layer over the free layer structure, and a reference layer structure over the barrier layer. The device also includes the MTJ film forming at least one MTJ pillar. The spin hall metal layer forms a respective spin hall electrode for each of the at least one MTJ pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic memory device comprising:
    a spin Hall electrode (SHE), the SHE comprising a spin Hall metal, the SHE having a longitudinal axis extending along a first axis;
    a magnetic tunnel junction (MTJ) stack disposed over the SHE, the MTJ comprising a synthetic anti-ferromagnetic free layer interfacing with the SHE, the synthetic anti-ferromagnetic free layer comprising a first magnetic layer, a second magnetic layer, and a spacer layer interposed between the first magnetic layer and the second magnetic layer, wherein the synthetic anti-ferromagnetic free layer has an easy axis in a first plane and has an equilibrium magnetic moment, in the absence of current flow in the SHE, that is in the first plane and askew of the easy axis;
    a first conductive line coupled to a first end of the SHE; and
    a second conductive line coupled to a second end of the SHE.

2. The magnetic memory device of claim 1, wherein the SHE comprises tungsten, platinum, or tantalum, and the spacer layer comprises tungsten at a thickness between 4 Å and 8 Å.

3. The magnetic memory device of claim 1, wherein the first magnetic layer and the second magnetic layer are in a synthetic anti-ferromagnetic configuration.

4. The magnetic memory device of claim 1, wherein a crystalline structure of a barrier layer of the MTJ stack matches a crystalline structure of the SHE.

5. The magnetic memory device of claim 1, wherein the spacer layer is configured to block a crystalline structure of the first magnetic layer from propagating to the second magnetic layer, wherein the crystalline structure of the first magnetic layer is different from a crystalline structure of the second magnetic layer.

6. The magnetic memory device of claim 1, wherein the spacer layer comprises ruthenium, tungsten, tantalum, molybdenum, or chromium.

7. The magnetic memory device of claim 6, wherein the spacer layer comprises ruthenium and the first magnetic layer comprises a first sub-layer of CoFe interfacing with the spacer layer and second sub-layer of CoFeB interfacing with the SHE.

8. The magnetic memory device of claim 1, wherein the MTJ stack has an elliptical shape in top down view and a long axis of the MTJ stack is parallel to a direction of current flow between the first end of the SHE and the second end of the SHE.

9. The magnetic memory device of claim 1, wherein the synthetic anti-ferromagnetic free layer has a default magnetic moment which is tilted from a long axis of the MTJ stack.

10. A magnetic memory device comprising:
    a spin Hall electrode (SHE), the SHE having a long axis extending in a first direction; and
    a top-pinned magnetic tunnel junction (MTJ) stack disposed over the SHE, the MTJ stack having a long axis extending in the first direction and comprising:
        a spacer layer interposed between a first free layer of the MTJ stack and a second free layer of the MTJ stack, the first free layer and the second free layer magnetically coupled by an anti-ferromagnetic configuration, wherein the first free layer has a default magnetic moment, in the absence of current flow in the SHE, which is tilted in-plane from the long axis of the MTJ stack in top down view;
a reference layer structure disposed over the second free layer; and
a barrier layer interposed between the second free layer and the reference layer structure.

11. The magnetic memory device of claim 10, wherein the MTJ stack has an elongated shape, wherein an axis of the MTJ stack is parallel to a current flow direction through the SHE.

12. The magnetic memory device of claim 11, wherein the first free layer and the second free layer have magnetic moments which have a non-zero x-component and a non-zero y-component.

13. The magnetic memory device of claim 10, wherein a thickness of the spacer layer is configured to cause the first free layer and the second free layer to be in the anti-ferromagnetic configuration, the thickness being between 4 Å and 8 Å.

14. The magnetic memory device of claim 10, wherein the reference layer structure comprises a reference layer adjacent the barrier layer, a pinned layer, and a second spacer layer interposed between the reference layer and the pinned layer, wherein the reference layer structure is in an anti-ferromagnetic configuration.

15. The magnetic memory device of claim 10, wherein the first free layer comprises a first layer of CoFeB interfacing the SHE and a second layer of CoFe interfacing the spacer layer, the spacer layer comprising ruthenium.

16. A device comprising:
a spin Hall electrode over an interlayer dielectric of an interconnect structure, the spin Hall electrode having a longitudinal axis extending along a first axis in a first plane;
a magnetic tunnel junction (MTJ) film stack, including:
a synthetic anti-ferromagnetic free layer structure over the spin Hall electrode, the synthetic anti-ferromagnetic free layer structure having a longitudinal axis extending along the first axis, the synthetic anti-ferromagnetic free layer structure including a first magnetic layer, a second magnetic layer, and a spacer layer interposed between the first magnetic layer and the second magnetic layer, wherein the first magnetic layer and the second magnetic layer have opposite respective magnetic moments that are parallel to the first plane and tilted in-plane from the first axis;
a barrier layer over the synthetic anti-ferromagnetic free layer structure; and
a reference layer structure over the barrier layer; and
the MTJ film forming at least one MTJ pillar having a longitudinal axis extending in a direction perpendicular to the first plane.

17. The device of claim 16, wherein the synthetic anti-ferromagnetic free layer structure comprises:
a first magnetic material layer on the spin Hall electrode;
a spacer layer on the first magnetic material layer; and
a second magnetic material layer on the spacer layer, wherein the spacer layer has a first thickness, the first thickness causing the first magnetic material layer and second magnetic material layer to be anti-ferromagnetic.

18. The device of claim 17, wherein the first magnetic material layer has a first crystalline structure, and the second magnetic material layer has a second crystalline structure different from the first crystalline structure.

19. The device of claim 16, wherein the spin Hall electrode has a first crystalline structure, and the barrier layer has a second crystalline structure different from the first crystalline structure.

20. The device of claim 16, configured such that a current from a first end of the respective spin Hall electrode to a second end of the respective spin Hall electrode causes a spin orbit torque in the respective spin Hall electrode to induce a corresponding spin orbit torque in a free magnetic layer structure, the spin orbit torque causing a magnetic moment of the free magnetic layer structure to change from a first state to a second state, the first state corresponding to a magnetic moment of the free magnetic layer structure which is skewed from a direction of a flow of the current.

* * * * *